(12) United States Patent
Ahmed et al.

(10) Patent No.: US 11,322,546 B2
(45) Date of Patent: May 3, 2022

(54) CURRENT DELIVERY AND SPIKE MITIGATION IN A MEMORY CELL ARRAY

(71) Applicant: Intel Corporation, Santa Clara, CA (US)

(72) Inventors: Shafqat Ahmed, San Jose, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/145,084

(22) Filed: Sep. 27, 2018

(65) Prior Publication Data
US 2019/0043923 A1  Feb. 7, 2019

(51) Int. Cl.
| | |
|---|---|
| H01L 27/24 | (2006.01) |
| H01L 45/00 | (2006.01) |
| H01L 27/22 | (2006.01) |
| H01L 27/11507 | (2017.01) |
| H01L 43/12 | (2006.01) |

(Continued)

(52) U.S. Cl.
CPC ........ *H01L 27/2463* (2013.01); *G11C 13/003* (2013.01); *G11C 13/0026* (2013.01); *G11C 13/0028* (2013.01); *G11C 13/0033* (2013.01); *H01L 27/11507* (2013.01); *H01L 27/224* (2013.01); *H01L 27/2409* (2013.01); *H01L 27/2427* (2013.01); *H01L 27/2481* (2013.01); *H01L 43/02* (2013.01); *H01L 43/12* (2013.01); *H01L 45/1233* (2013.01); *H01L 45/1246* (2013.01); *H01L 45/1253* (2013.01); *H01L 45/141* (2013.01); *H01L 45/145* (2013.01); *H01L 45/16* (2013.01); *G11C 2213/51* (2013.01); *G11C 2213/52* (2013.01); *G11C 2213/71* (2013.01); *H01L 28/60* (2013.01); *H01L 45/04* (2013.01); *H01L 45/06* (2013.01); *H01L 45/08* (2013.01); *H01L 45/085* (2013.01); *H01L 45/10* (2013.01)

(58) Field of Classification Search
CPC ........... H01L 27/2463; H01L 27/11507; H01L 27/224; H01L 27/2481
See application file for complete search history.

(56) References Cited

U.S. PATENT DOCUMENTS

| | | |
|---|---|---|
| 9,792,986 B2 | 10/2017 | Taub et al. |
| 2014/0241031 A1* | 8/2014 | Bandyopadhyay .......................... H01L 27/11206 365/96 |
| 2019/0096461 A1* | 3/2019 | Koike ..................... H01L 43/02 |

* cited by examiner

*Primary Examiner* — Trang Q Tran
(74) *Attorney, Agent, or Firm* — Compass IP Law PC

(57) ABSTRACT

A single memory cell array is formed to maintain current delivery and mitigate current spike through the deposition of resistive materials in two or more regions of the array, including at least one region of memory cells nearer to contacts on the conductive lines and at least one region of memory cells farther from the contacts, where the contacts connect the conductive lines to the current source. Higher and lower resistive materials are introduced during the formation of the memory cells and the conductive lines based on the boundaries and dimensions of the two or more regions using a photo mask. Multiple memory cell arrays formed to maintain current delivery and mitigate current spike can be arranged into a three-dimensional memory cell array. The regions of memory cells in each memory cell array can vary depending on resistance at the contacts on the conductive lines that provide access to the memory cells, where the resistance can vary from one memory cell array to another.

22 Claims, 17 Drawing Sheets

(51) Int. Cl.
*H01L 43/02* (2006.01)
*G11C 13/00* (2006.01)
*H01L 49/02* (2006.01)

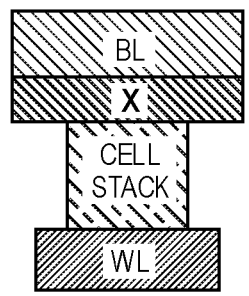 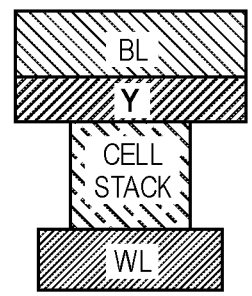
FIG. 6A    FIG. 6B
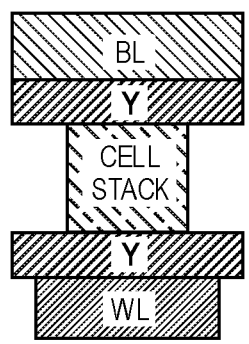 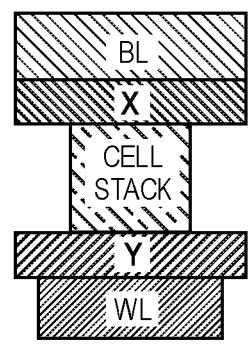
FIG. 6C    FIG. 6D
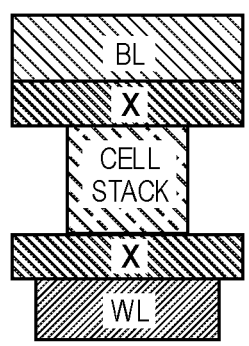 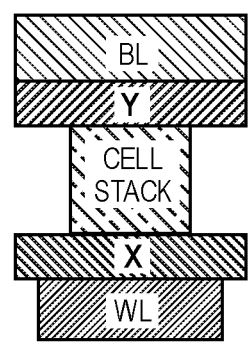
FIG. 6E    FIG. 6F

CURRENT DELIVERY AND SPIKE MITIGATION IN A MEMORY CELL ARRAY

FIELD

The descriptions are generally related to memory, and more particularly to memory cell arrays.

BACKGROUND

Memory elements can be arranged in a memory array including row address lines and column address lines. The row address lines and column address lines, respectively described herein as word lines (WLs) and bit lines (BLs), are each composed of a conductive material. The WLs are orthogonal to the BLs to form a grid into which the memory elements are arranged in the memory array. Multiple memory arrays can be arranged as layers of a three-dimensional (3D) memory, such as, but not limited to, a 3D cross-point memory structure.

Each memory element of a 3D cross-point memory structure, referred to as a memory cell, may be composed of a resistive memory cell material that is capable of storing data that can be accessed when voltages are applied to a WL and BL coupled to the memory cell. A memory cell is said to be "selected" by applying bias voltages to a selected WL and BL coupled to the memory cell.

To prepare for accessing the data in a memory cell, selected WL(s), selected BL(s), associated capacitances and/or sense circuitry are charged to respective bias voltage(s). When a resistance associated with the memory cell decreases abruptly, for example from an approximately open circuit to a finite resistance in a time interval on the order of tens of picoseconds, the change in resistance in the memory cell creates a current path that allows a transient current to flow between the selected WL(s) and selected BL(s) via the memory cell.

Depending on the type of resistive memory cell material, the transient current can result in a current spike that decays over time. Thus, the transient current has a peak amplitude and a duration related to, inter alia, impedance in the current path. An amount of energy dissipated by the memory cell is related to the peak current (i.e., maximum transient current) and the rate of decay of the transient current. Such a current spike may damage a memory cell, cause the memory cell to not set or reset properly during a set or reset state write operation, increase the memory cell threshold voltage so that the memory cell cannot be accessed properly, and/or induce thermal disturbance of neighboring memory cell(s).

BRIEF DESCRIPTION OF THE DRAWINGS

In the description that follows, examples may include subject matter such as a method, a process, a means for performing acts of the method or process, an apparatus, a memory device, a system, and at least one machine-readable tangible storage medium including instructions that, when performed by a machine or processor, cause the machine or processor to performs acts of the method or process according to described embodiments illustrated by way of example and not limitation in the figures of the accompanying drawings, in which like references indicate similar elements and in which:

FIGS. 6A through 6J illustrate various cross-section views of a memory cells in a memory cell array formed in accordance with various examples described herein;

Figure 1:
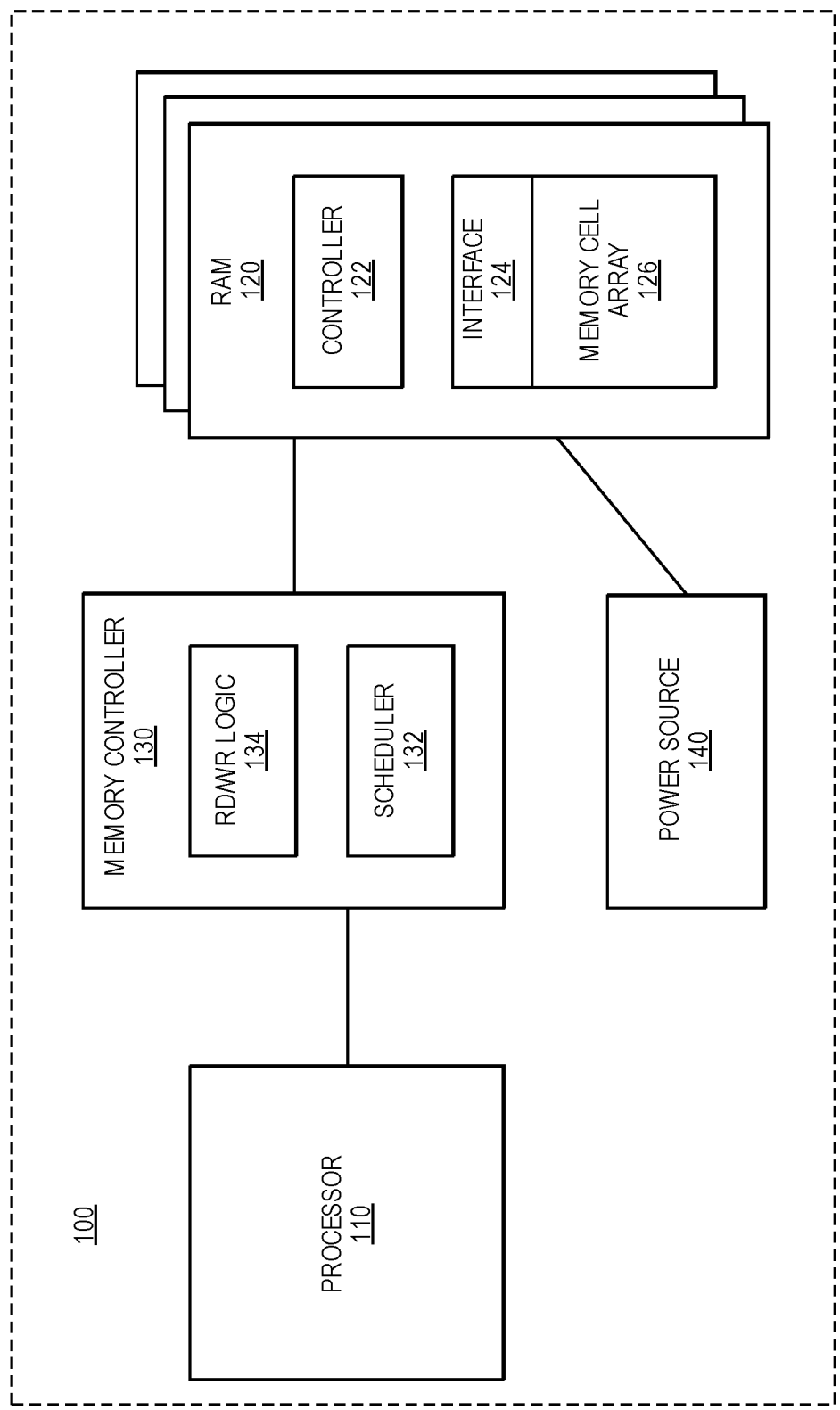
FIG. 1 is a schematic block diagram of a memory device that includes a memory cell array formed in accordance with various examples described herein.

Other features of the described embodiments will be apparent from the accompanying drawings and from the detailed description that follows.

DETAILED DESCRIPTION

Memory cells located farther from the current source of the memory cell array are relatively immune from the problems of current spike as compared to the memory cells located nearer to the current source, in part because of the resistance of the conductive lines that couple the memory cells to the current source. For this reason, attempts to protect memory cells located nearer to the current source can adversely affect current delivery to the memory cells located farther from the current source. Previous efforts to address the twin problems of current spike and current delivery in memory cell arrays include dynamically controlling one or more of the current, voltage change and resistance of a selected memory cell current path during reading and/or programming. But dynamic controls do not address the inherent problem in a memory cell array of delivering sufficient programming current to memory cells located farther from the current source while managing the hazards of a current spike when selecting memory cells located nearer to the current source.

To address the vulnerability of near memory cells without jeopardizing current delivery to far memory cells, a memory cell array formed in accordance with the embodiments herein described enables better current delivery and mitigation of current spike through the introduction of a layer of resistive material in one or more regions of memory cells in the memory cell array. The one or more regions of memory cells includes near memory cells located nearer to contacts to a current source of the memory cell array and far memory cells located farther from contacts to the current source. The contacts are typically located at one end of the conductive lines near the respective WL and BL decoders that drive them. The relative proximity of a memory cell to the contacts is based on the electrical distance from the memory cell to the contacts.

In one embodiment a resistive material is deposited on one or more of the conductive lines coupled to memory cells in the memory cell array. The resistive material introduced in a near region has a higher level of resistivity while the resistive material introduced in a far region has a lower level of resistivity. The higher level of resistivity protects the memory cells in the near region from damage from current spikes while the lower level of resistivity maintains current delivery to the memory cells in the far region. The resulting memory cell array has greater overall durability than memory cell arrays formed without the introduction of one or more layers of resistive material. In one embodiment, multiple memory cell arrays formed in accordance with the various examples described herein can be arranged in layers of a three-dimensional memory array structure in which the memory cells have greater overall durability than the memory cells in a three-dimensional memory array structure formed without the introduction of the one or more layers of resistive material.

FIG. 1 is a schematic block diagram of a memory device that includes a memory cell array formed in accordance with various examples described herein. System 100 includes components of a memory subsystem having random access memory (RAM) 120 to store and provide data in response to operations of processor 110. System 100 receives memory access requests from a host or a processor 110, which is processing logic that executes operations based on data stored in RAM 120 or generates data to store in RAM 120. Processor 110 can be or include a host processor, central processing unit (CPU), microcontroller or microprocessor, graphics processor, peripheral processor, application specific processor, or another processor, and can be single core or multicore.

System 100 includes memory controller 130, which represents logic to interface with RAM 120 and manage access to data stored in the memory. In one embodiment, memory controller 130 is integrated into the hardware of processor 110. In one embodiment, memory controller 130 is stand-alone hardware, separate from processor 110. Memory controller 130 can be a separate circuit on a substrate that includes the processor. Memory controller 130 can be a separate die or chip integrated on a common substrate with a processor die (e.g., as a system on a chip (SoC)). In one embodiment, memory controller 130 is an integrated memory controller (iMC) integrated as a circuit on the processor die. In one embodiment, at least some of RAM 120 can be included on an SoC with memory controller 130 and/or processor 110.

In one embodiment, memory controller 130 includes read/write logic 134, which includes hardware to interface with RAM 120. Logic 134 enables memory controller 130 to generate read and write commands to service requests for data access generated by the execution of instructions by processor 110. In one embodiment, memory controller 130 includes scheduler 132 to schedule the sending of access commands to RAM 120 based on known timing parameters for read and write access for RAM 120. Known timing parameters can be those that are preprogrammed or otherwise preconfigured into system 100. Such parameters can be stored in RAM 120 and accessed by memory controller 130. In one embodiment, at least some parameters are determined by synchronization procedures. The timing parameters can include the timing associated with write latency for RAM 120. The write latency for RAM 120 can depend on the type of memory technology.

In one embodiment, RAM 120 can be composed of materials that enable accessing a value of a memory cell within an array of memory cells, such as detecting changes in resistance of the memory cell to determine the value. One example of materials that enable accessing value is programming and selector material as described in further detail below. In one such embodiment, the materials can include a phase change memory that can be electrically switched between a generally amorphous and a generally crystalline state across the entire spectrum between completely amorphous and completely crystalline states, a phase change region, a single or multi-level Phase Change Memory (PCM) or phase change memory with a switch (PCMS), chalcogenide phase change material (for example, chalcogenide glass), and other types of resistive memory material including metal oxide base, oxygen vacancy base and conductive bridge random access memory (CB-RAM), ferroelectric transistor random access memory (FeTRAM), magnetoresistive random access memory (MRAM) memory that incorporates memristor technology, or spin transfer torque (STT)-MRAM. The memory resources or cachelines in RAM 120 are represented by memory cell array 126, which can include conductive lines (bitline and wordline) and memory cells composed of materials that enable detection of changes in value, all of which are arranged in the memory cell array. Introduced into the memory cell array are any of a higher and lower (or no) resistive layer to decrease or increase a resistance of the current path for accessing a specific memory cell in accordance with embodiments described herein. RAM 120 includes interface 124 (e.g., interface logic) to control the access to memory cell array 126. Interface 124 can include decode logic, including logic to address specific rows or columns or bits of data. In one embodiment, interface 124 includes logic to control the amount of current provided to specific memory cells of memory device array 126. Thus, control over writing to memory cell array 126 can occur through driver and/or other access logic of interface 124. Controller 122 represents an on-die controller on RAM 120 to control its internal operations to execute commands received from memory controller 130. For example, controller 122 can control any of timing, addressing, I/O (input/output) margining, scheduling, and error correction for RAM 120.

In one embodiment, controller 122 is configured to read and write memory cell array 126 in accordance with any embodiment described herein. In one embodiment, controller 122 can differentiate between different logic-states as a consequence of the programming polarity of a memory cell. For example, in one embodiment, controller 122 can read a memory cell by applying a voltage drop via interface 124 to the memory cell to determine the state (e.g., a higher stable state or lower stable state) of the memory cell.

In one embodiment, when controller 122 is to write to a memory cell, controller 122 applies a quick pulse to the memory cell to program the polarity of the memory cell. In one such embodiment, programming in forward polarity will put the cell in one state (e.g., a lower threshold state) and programming in reverse polarity will put the cell in the other state (e.g., a higher threshold state). For example, in one embodiment, controller 122 applies a pulse in one polarity (e.g., bitline positive and wordline negative) to write a value or in the other polarity (e.g., bitline negative and wordline positive) to write another value. In one such embodiment, controller 122 applies a pulse that is sufficient to trigger the storage material in its higher or lower stable state. System 100 includes power source 140, which can be a voltage source or regulator that provides power to RAM 120. Controller 122 and interface 124 can use the power available from power source 140 to apply a voltage drop to access a memory cell of array 126.

Figure 2:
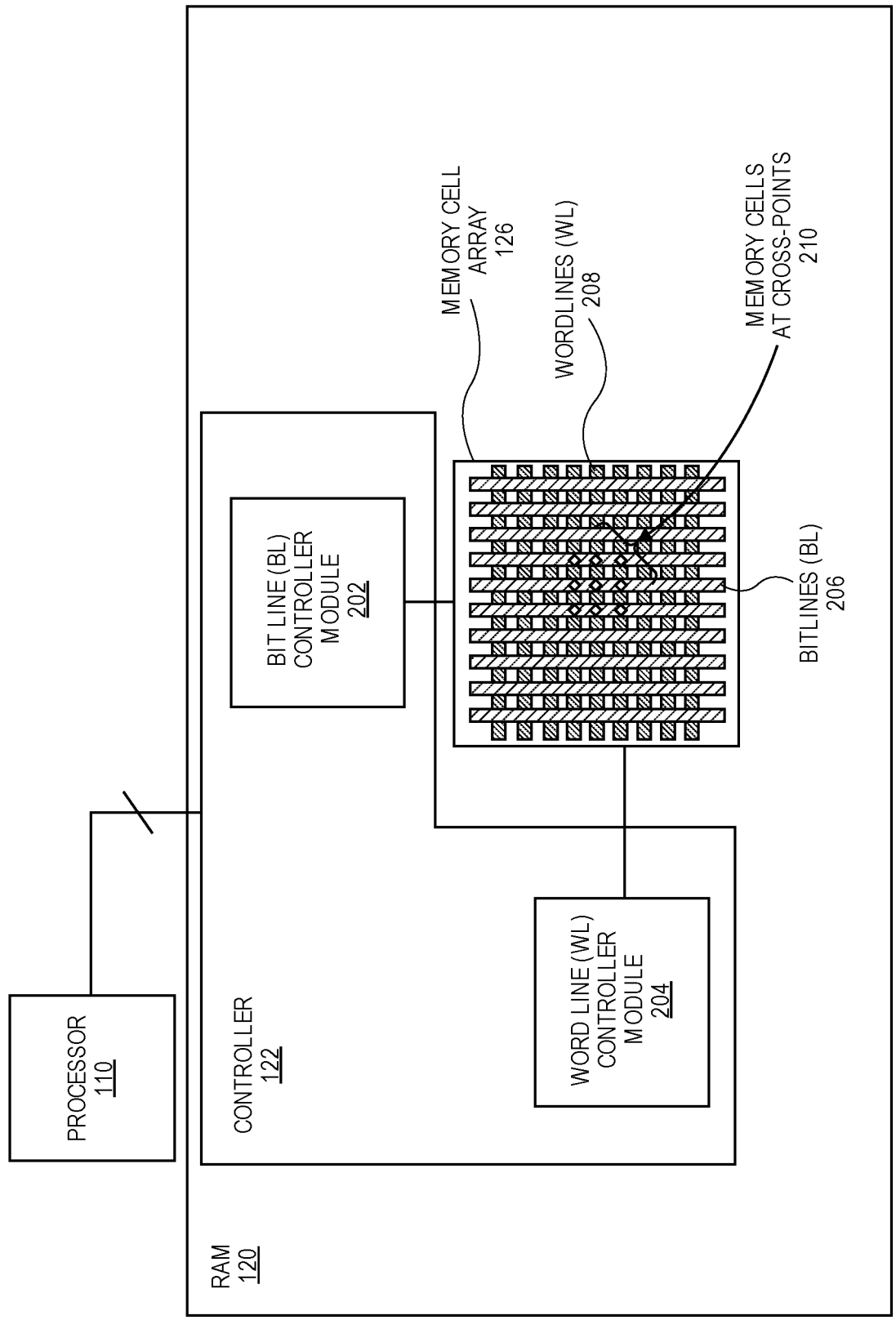
FIG. 2 is a schematic block diagram of further details of a memory device that includes a memory cell array formed in accordance with various examples described herein.

FIG. 2 is a schematic block diagram of further details of a memory device that includes a memory cell array formed in accordance with various examples described herein. The processor 110 communicates with RAM 120 via controller 122. Memory cell array 126 corresponds to at least a portion of a 3D cross-point memory structure and includes a plurality of word lines ("WL") 208, a plurality of bit lines ("BL") 206 and a plurality of memory cells, e.g., memory cells 210. Each memory cell is coupled to a word line ("WL") and a bit line ("BL") at a location where the WL and the BL cross. Each memory cell includes a memory element configured to store information and may include a memory cell select device coupled to the memory element. Select devices may include ovonic threshold switches, diodes, bipolar junction transistors, field-effect transistors, etc. Memory array 106 is configured to store data and may be written to (i.e., programmed) or read from.

Memory controller 122 includes WL control module 204 and BL control module 202. Memory controller 122 may be configured to identify one or more target WLs associated with each received memory address. Memory controller 122 is configured to manage operations of WL control module 204 and BL control module 202 based, at least in part, on the identified target WL.

Figure 3A:
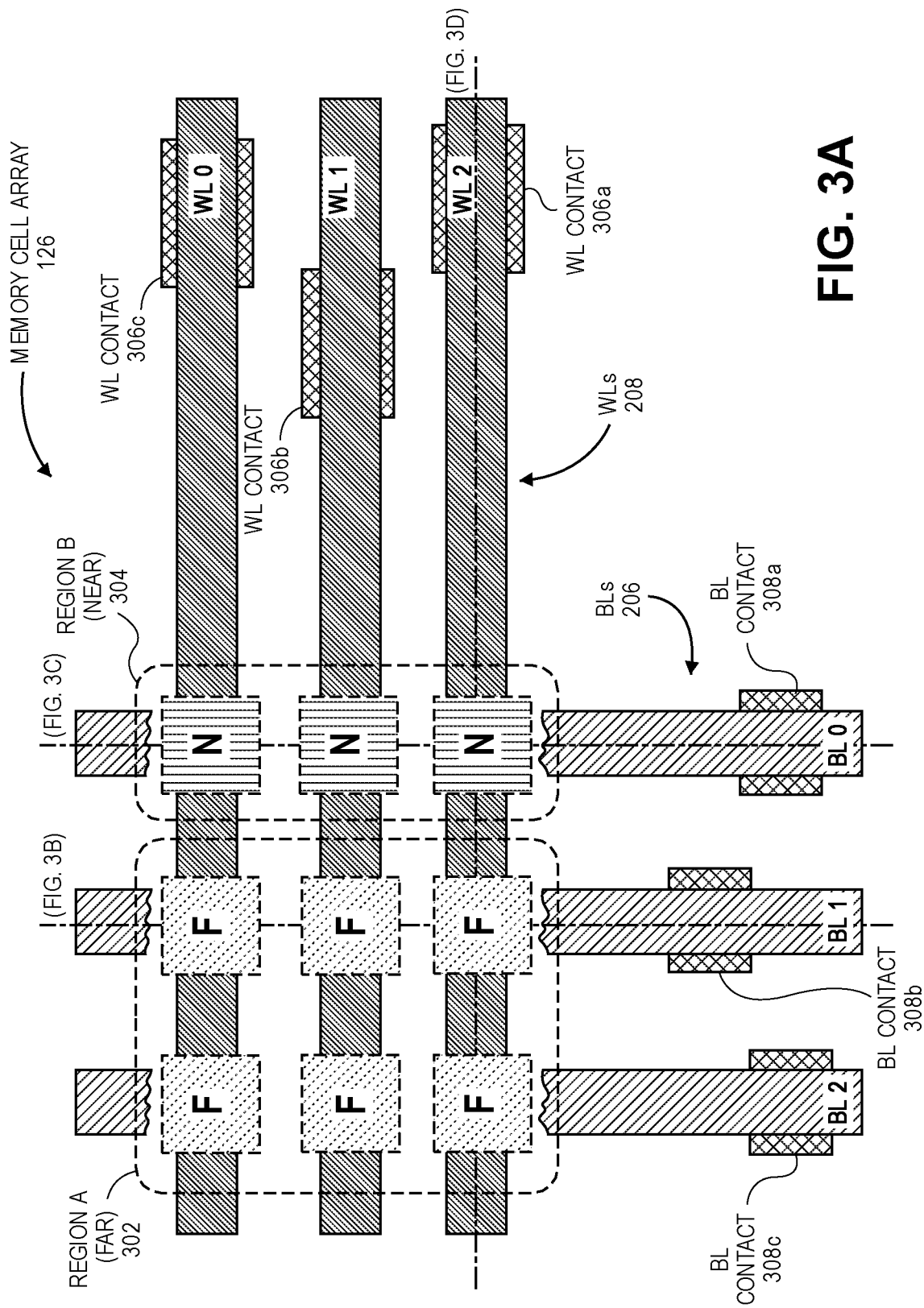
FIGS. 3A-3D illustrate a cutaway plan view and corresponding sectional views of selected components of a memory cell array formed in accordance with various examples described herein.

FIG. 3A illustrates a cutaway plan view of a single memory cell array formed in accordance with various examples described herein. By way of example only and for ease of illustration, the memory cell array 126 includes three bitlines BLs 206, labeled BL0, Bl 1, BL2 and further includes three wordlines WLs 208, labeled WL0, WL1, and WL2. The bitlines are in one plane and the wordlines are in a parallel plane oriented orthogonally to the bitlines such that the wordlines and bitlines overlap at cross points. Memory cells are located within the cross points such that each memory cell is coupled on one end to a wordline and on the opposite end to the overlapping bitline to form a 3×3 memory cell array 126. Of course, in a typical implementation, the actual number of BLs and WLs would number in the hundreds and the number of memory cells in the thousands.

As shown in the illustrated example memory cell array 126, the BLs are illustrated with a cutaway section to reveal each of the nine memory cells of the 3×3 array at the cross points where the WLs 208 and BLs 206 overlap, including three near memory cells labeled "N", and six far memory cells labeled "F". A series of WL contacts 306*a*/306*b*/306*c* is located on each WL 208 coupling the memory cell array to power source 140 (not shown), and a series of BL contacts 308*a*/308*b*/308*c* is located on each BL 206 coupling the memory cell array to the power source. Two regions, Region A 302 and Region B 304, define the boundaries of cells located farther from the WL contacts 306, i.e. Region A encompassing the "F" cells located further from the WL contacts 306, i.e. Region B encompassing the "N" cells located nearer to the WL contacts 306 and/or BL contacts 308. In some embodiments, Region A and Region B could also be defined based on location of the memory cells relative to only the BL contacts 308 instead of the WL contacts 306.

Figure 3B:
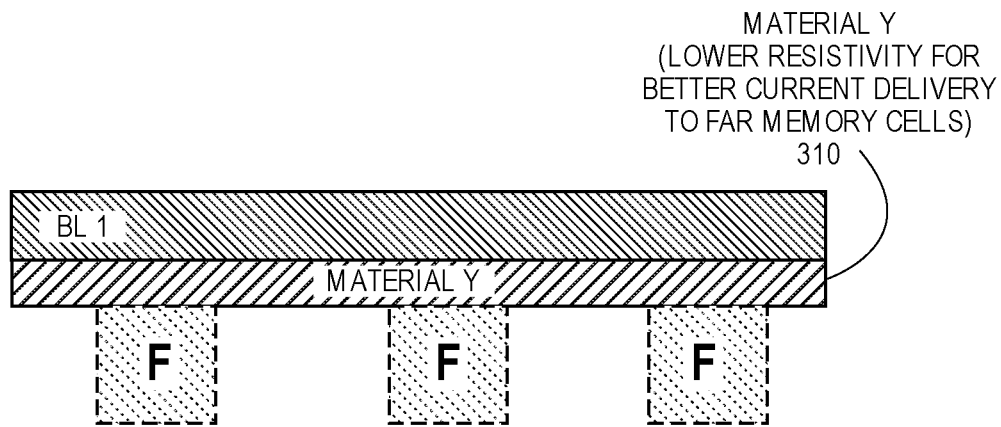
Figure 3C:
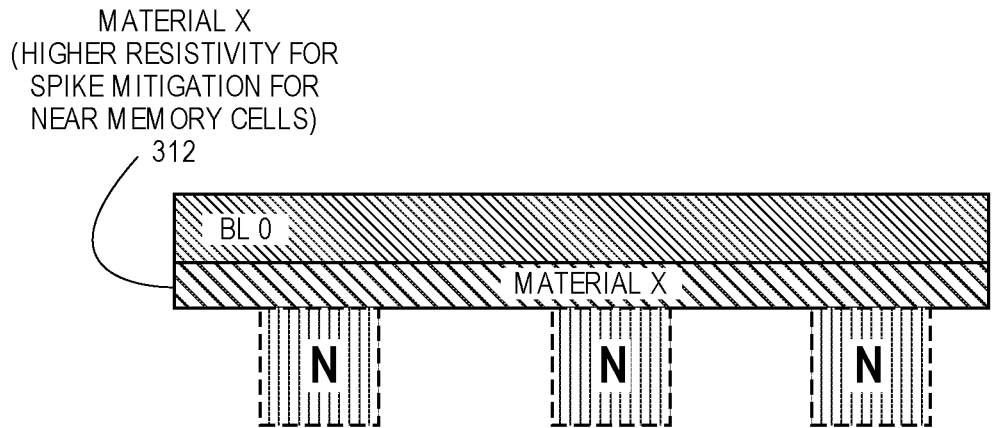

With reference to FIGS. 3B-3C, because the near memory cells are more prone to current spikes, a higher resistance material 312 is introduced along the conductive lines coupled to the near memory cells. Because current delivery to the far memory cells might be impacted by their distance from the WL contacts as well as the introduction of the higher resistance material to mitigate spike for the near memory cells, a lower resistance material (or no material) 310 is introduced along the conductive lines coupled to the far memory cells.

In one embodiment, the higher and lower resistance materials are introduced on the overlapping conductive lines that are orthogonal to the conductive lines whose contacts determine whether cells are classified as near or far for defining Region A and Region B. In one embodiment, the higher and lower resistance materials are introduced on the same conductive lines whose contacts determine whether cells are classified as near or far for defining Regions A and Regions B. In some embodiments, the higher and lower resistance materials can be introduced on both sets of conductive lines, the BLs 206 and the WLs 208, to provide more robust spike mitigation and current delivery for the near and far memory cells, albeit at greater fabrication cost.

For example, with reference to FIGS. 3B-3C, during formation of the memory cell array 126, a lower resistance material (or no material) 310 is deposited along the BLs 206 coupled to far memory cells in Region A (such as BL1 in FIG. 3B) and a higher resistance material 312 is deposited along the BLs 206 coupled to near memory cells in Region B (such as BL0 in FIG. 3C), where the overlapping BLs 206 are orthogonal to the WLs 208 and the determination of the regions of near and far memory cells is based on a memory cell's proximity to the WL contacts 306*a*/306*b*/306*c*.

Figure 3D:
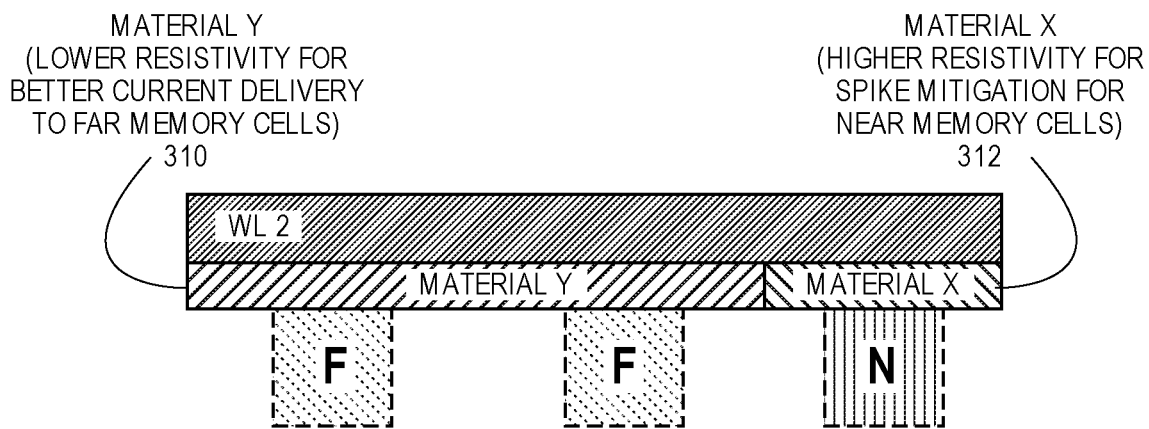

In one embodiment, as illustrated in FIG. 3D, the higher and lower resistance materials are introduced on the same conductive lines whose contacts determine whether memory cells are classified as near or far for defining Region A and Region B. For example, with reference to FIG. 3D, during formation of the memory cell array 126, a lower resistance material (or no material) 310 is deposited along a first portion of the WLs 208 (e.g., WL2 in FIG. 3D) coupled to far memory cells in Region A and a higher resistance material is deposited along a second portion of the same WLs 208 coupled to near memory cells in Region B, where the determination of the regions of near and far memory cells is based on a memory cell's proximity to the WL contacts 306*a*/306*b*/306*c*.

Figure 4A:
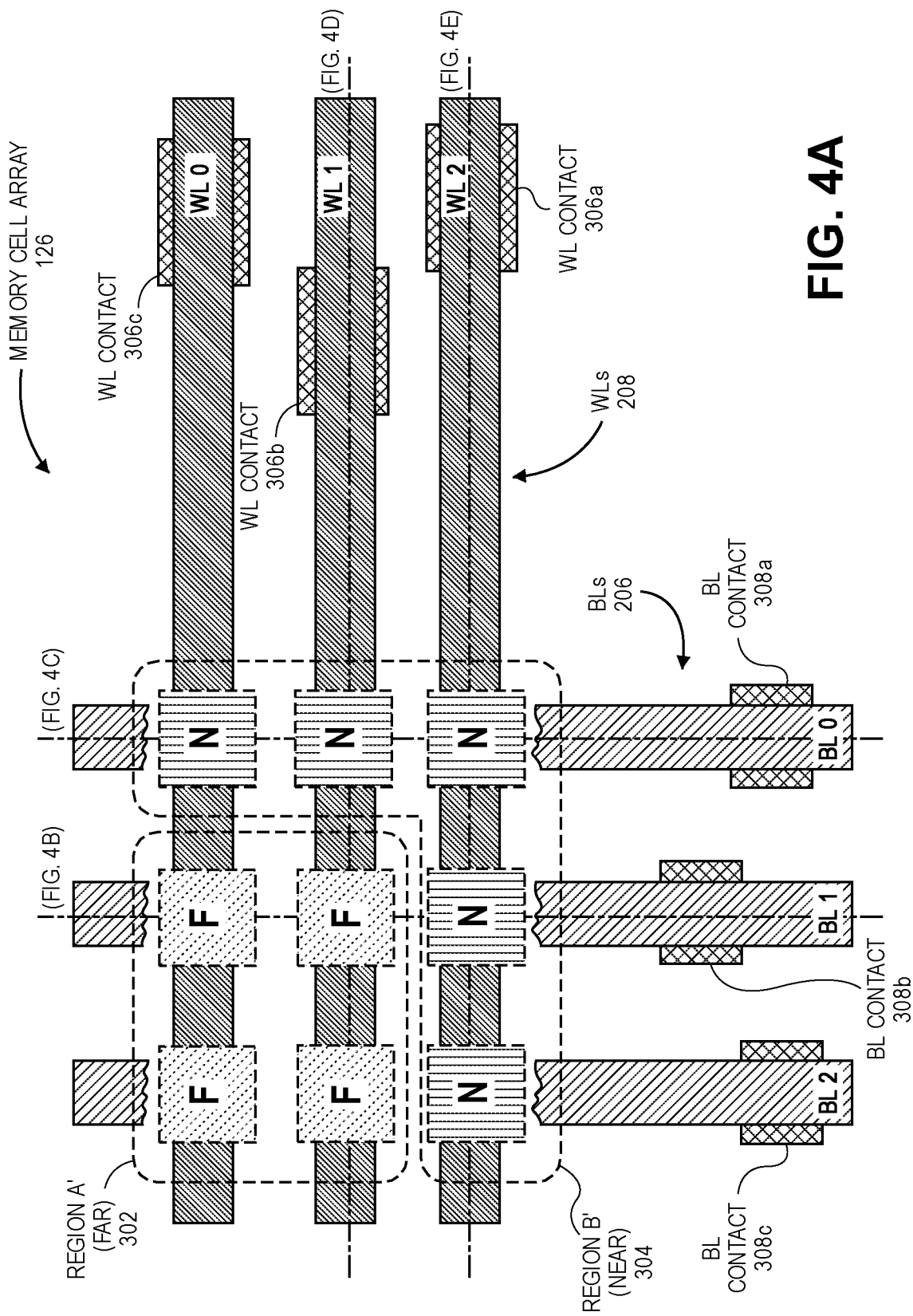
FIGS. 4A through 4E illustrate a cutaway plan view and corresponding sectional views of selected components of a memory cell array formed in accordance with various examples described herein.

FIG. 4A illustrates a cutaway plan view of a single memory cell array formed in accordance with various examples described herein. The memory cell array 126 illustrated in FIG. 4A is the same as the memory cell array illustrated in FIG. 3A, and includes three bitlines BLs 206, labeled BL0, Bl 1, BL2 and further includes three wordlines WLs 208, labeled WL0, WL1, and WL2. The bitlines are in one plane and the wordlines are in a parallel plane oriented orthogonally to the bitlines such that the wordlines and bitlines overlap at cross points. Memory cells are located within the cross points such that each memory cell is coupled on one end to a wordline and on the opposite end to the overlapping bitline to form a 3×3 memory cell array 126.

In contrast to the memory cell array in FIG. 3A, the cutaway section in FIG. 4A reveals five near memory cells labeled "N", and four far memory cells labeled "F". In this example Region A and Region B are defined based on location of the memory cells relative to both the BL contacts 308 and the WL contacts 306 instead of just one set of contacts. As a result, some of the WLs and the BLs span memory cells located in both Region A and Region B, while some of the WLs and the BLs span memory cells located only in Region B as described in further detail in the sectional views contained in FIGS. 4B through 4E.

Figure 4B:
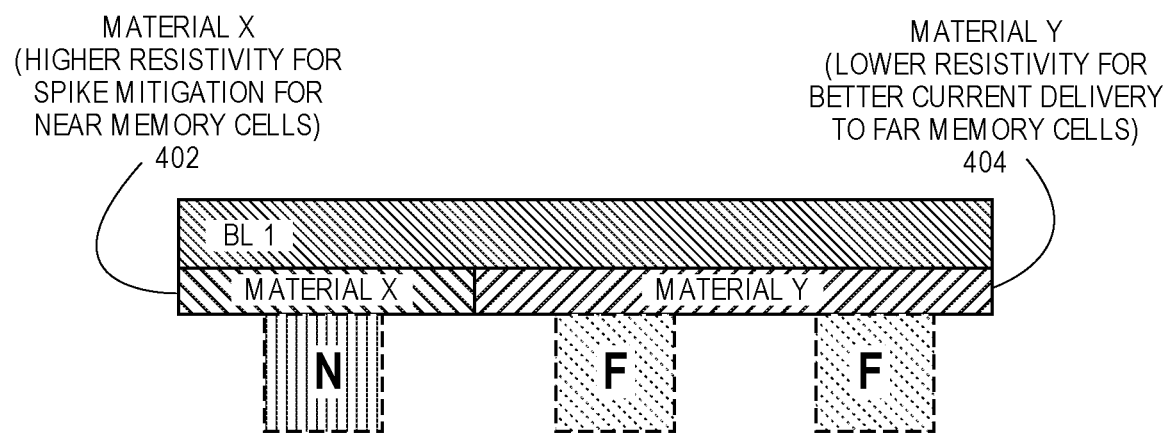
Figure 4C:
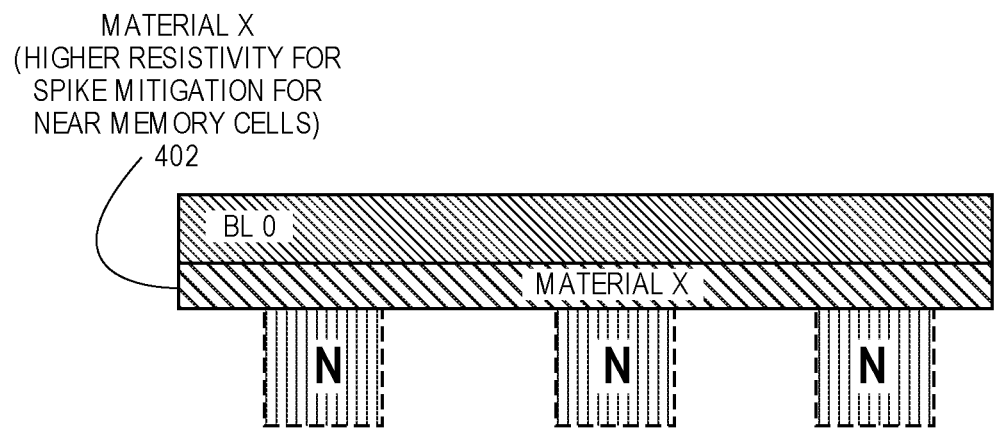

FIGS. 4B through 4E illustrate sectional views of selected components of a memory cell array formed in accordance with various examples described herein. For example, FIG. 4B illustrates a sectional view of one example BL 206 that spans memory cells located in both Region A and Region B. As shown, BL1 is coupled to one N and two F memory cells. Introduced during the formation of the memory cell stack and the BLs is Material X 402, a higher resistivity material to mitigate current spike for the N memory cell, and Material Y 404, a lower resistivity material, to enable better current delivery to the F memory cells. FIG. 4C illustrates a sectional view of BL0 spanning only Region B, the N cells. As shown, BL0 is coupled to three N cells. Introduced during the formation of the memory cell stack and the BLs for each N cell is Material X 402, a higher resistivity material to mitigate current spike.

Figure 4E:
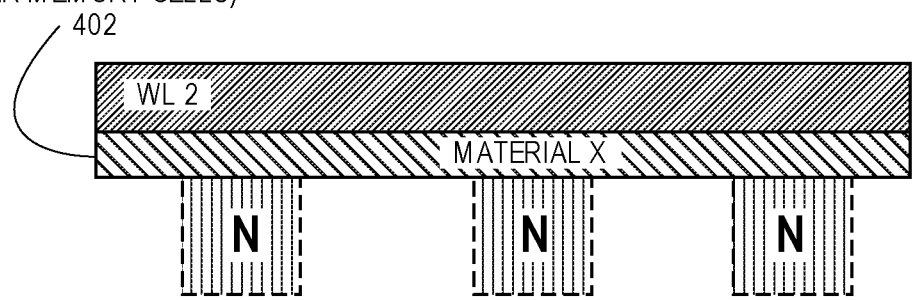
Figure 4D:
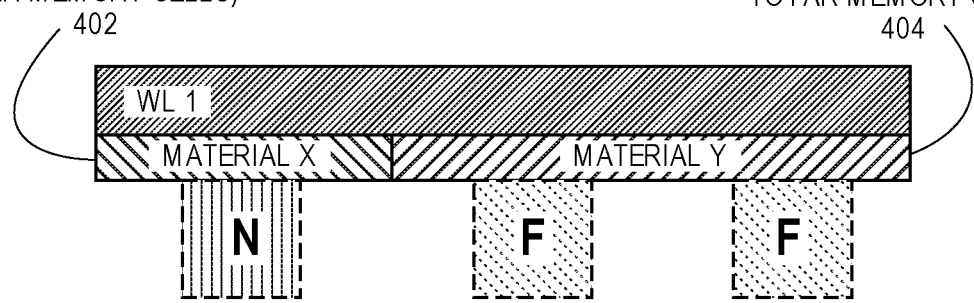

FIG. 4D illustrates a sectional view of WL0 spanning only Region B, the N cells. As shown, WL0 is coupled to three N cells. Introduced during the formation of the memory cell stack and WLs for each N cell is Material X 402, a higher resistivity material to mitigate current spike. FIG. 4E illustrates a sectional view of WL1 that spans memory cells located in both Region A and Region B. As shown, WL1 is coupled to one N and two F memory cells. Introduced during the formation of the memory cell stack and WLs is Material X 402, a higher resistivity material to mitigate current spike for the N memory cell, and Material Y 404, a lower resistivity material, to enable better current delivery to the F memory cells.

Figure 5:
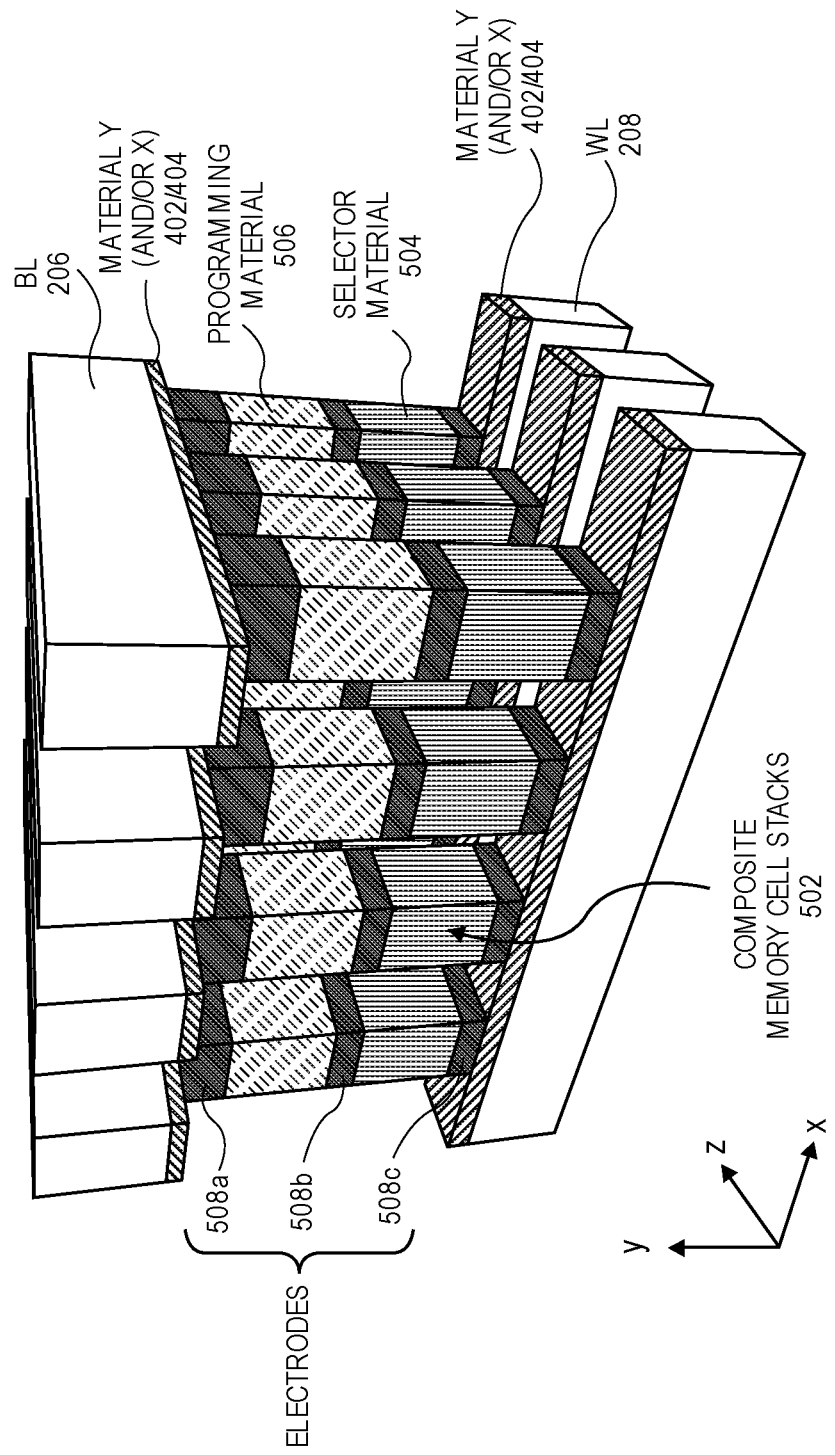
FIG. 5 illustrates a perspective view of a portion of a memory cell array formed in accordance with various examples described herein.

FIG. 5 is a perspective view of a portion of a memory cell array formed in accordance with various examples described herein. In one embodiment, memory cell array 500/126 as illustrated can represent a portion of a 3D cross-point memory structure. The memory cell array 500/126 includes a plurality of access lines, the conductive WLs 208 and BLs 206 used to couple the composite memory cell stacks 502 with access circuitry. In the embodiment illustrated in FIG. 5, BLs 206 are orthogonal to the WLs 208. As illustrated, a programming material 506 and selector material 504 comprise the composite memory cell stacks 502 at locations where the WLs 208 and BLs 206 cross. The programming and selector materials 506/504 can be a phase change memory material or other type of resistive memory material that enables accessing a value in memory. In one embodiment, the programming and selector materials 506/504 include a chalcogenide material. In accordance with one embodiment, the selector material 504 comprises a chalcogenide glass. Other embodiments can include other types of resistive memory material including metal oxide base, oxygen vacancy base and conductive bridge random access memory (CB-RAM), ferroelectric transistor random access memory (FeTRAM), magnetoresistive random access memory (MRAM) memory that incorporates memristor technology, or spin transfer torque (STT)-MRAM.

Referring again to the BLs 206 and WLs 208, a WL is for accessing a particular word in memory cell array 500/126 and the BL is for accessing a particular bit in the particular word. The BLs 206 and WLs 208 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In the embodiment illustrated in FIG. 5, the memory cell array 500/126 includes conductive electrodes 506*a*, 506*b* and 506*c* that electrically couple the layers of material that are on either side of a given electrode. Conductive electrodes 506*a*, 506*b* and 506*c* can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive WL 208 and BL 206 can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Each composite memory cell stack 502 in the memory cell array 500/126 can be programmed by applying voltage pulses to the memory cells. In one embodiment, writing information to a composite memory cell stack 502 involves applying voltage pulses with particular polarities to the memory cells. For example, programming a memory cell with a voltage pulse with one polarity results in the memory cell being in one logic state and programming the memory cell with a voltage pulse with a different polarity results in the memory cell being in a different logic state. Similarly, reading such memory cells can involve applying voltage pulses to the memory cells and detecting electrical responses from the memory cells.

Introduced during the formation of a composite memory cell stack 502 and a conductive line with which it is coupled is any of a material with higher resistivity, Material X 402, or lower resistivity, Material Y 404, as previously described with reference to FIG. 4. In one embodiment, the higher resistivity Material X 402 and lower resistivity Material Y 404 can include any suitable metal, including metals such as Ti and W as examples of lower resistivity Material Y 404, and metal nitride or metal silicide such as WN, WSiN, TiSiN, etc., as examples of higher resistivity Material X 402.

The higher and lower resistivity materials can be introduced along the BL 206 coupled to the composite memory cell stack 502 and/or along the WL 208 coupled to the composite memory cell stack 502. In one embodiment the higher and lower resistivity materials can be introduced along both the BL 206 and WL 208 coupled to the composite memory cell stack 502. In one embodiment, the introduction of the higher and lower resistivity materials includes depositing the material along the respective BL 206 and WL 208 coupled to the electrode of the composite memory cell stack 502. In one embodiment, the introduction of any of the higher and lower resistivity materials includes integrating any one or more of the resistive materials with the conductive line, i.e., the respective BL 206 and WL 208. Introducing the higher and lower resistivity materials mitigates current spike while maintaining current delivery during the programming and reading of composite memory cell stacks 502 of the memory cell array.

Although a single level or layer of composite memory cell stacks 502 with dimensions of a 3×4 memory cell array is shown in FIG. 5 for ease of illustration, a typical 3D cross-point memory cell array 500 can include multiple levels or layers of memory cells (e.g., in the z-direction), where any one (or more) of the layers can be a memory cell array 126 such as described with reference to FIGS. 3A-3D and FIGS. 4A-4E. Each memory cell array 126 can include hundreds or thousands of memory cells (e.g., in the x-y direction).

Figure 6G:
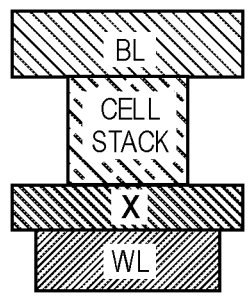
Figure 6H:
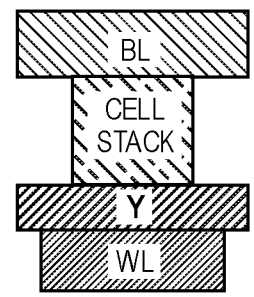

FIGS. 6A through 6J illustrate various cross-section views of a memory cells in a memory cell array 126 formed in accordance with various examples described herein. For example, FIGS. 6A through 6B illustrate two examples of a memory cell stack in which either Material X or Material Y has been introduced along the BL coupled to the memory cell stack, where the memory cell in FIG. 6A was determined to be a near cell and the memory cell in FIG. 6B was determined to be a far cell. Likewise, FIGS. 6G through 6H illustrate two examples of a memory cell stack in which either Material X or Material Y has been introduced along the WL coupled to the memory cell stack, where the memory cell in FIG. 6G was determined to be a near cell and the memory cell in FIG. 6H was determined to be a far cell.

FIG. 6C illustrates an example of a memory cell stack in which Material Y has been introduced along the BL and the WL coupled to the memory cell stack, where the memory cell in FIG. 6C was determined to be a far cell. Likewise, FIG. 6E illustrates an example of a memory cell stack in which Material X has been introduced along the BL and the WL coupled to the memory cell stack, where the memory cell in FIG. 6E was determined to be a near cell.

FIG. 6D illustrates an example of a memory cell stack in which Material X has been introduced along the BL coupled to the memory cell stack and Material Y has been introduced along the WL coupled to the memory cell stack, where the memory cell in FIG. 6D was determined to be near relative to the BL, but far relative to the WL. Likewise, FIG. 6F illustrates an example of a memory cell stack in which Material Y has been introduced along the BL coupled to the memory cell stack and Material X has been introduced along another portion of the WL coupled to the memory cell stack, where the memory cell in FIG. 6F was determined to be near relative to the WL, but far relative to the BL. In some embodiments, other permutations of memory arrays introducing any one or more materials having different levels of resistivity can be implemented.

Figure 6I:
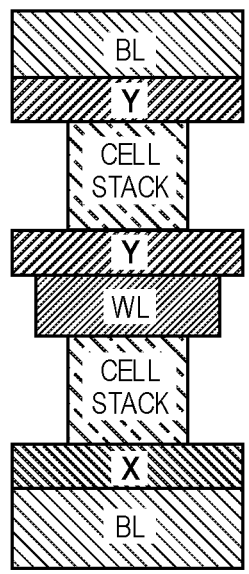
Figure 6J:
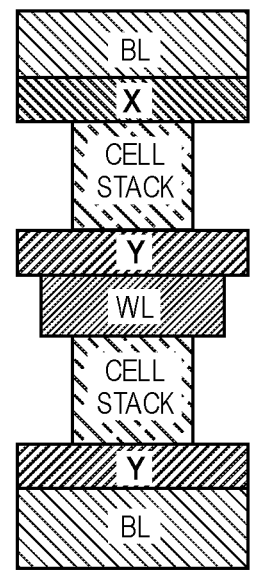

Lastly, by way of example only, FIGS. 6I through 6J illustrate a 3D stacked memory array. In FIG. 6I, Material Y has been introduced along both the BL and WL coupled to the memory cell stack in the upper level of the 3D stacked memory array where the memory cell stack is determined to be far relative to both the WL and BL. In contrast, Material X has been introduced along only the BL coupled to the memory cell stack in the lower level of the 3D stacked memory array where the memory cell stack is determined to be near relative to the BL, and no material has been introduced along the WL coupled to the memory cell stack.

In FIG. 6J, Material X has been introduced along the BL coupled to the memory cell stack and Material Y has been introduced along the WL coupled to the memory cell stack in the upper level of the 3D stacked memory array, while Material Y has been introduced along only the BL coupled to the memory cell stack in the lower level of the 3D stacked memory array, and no material has been introduced along the WL coupled to the memory cell stack.

Other permutations of a single memory cell array 126 introducing any one or more materials having different levels of resistivity can be implemented based on the determinations of whether the memory cell stacks in the single memory cell array 126 are any of near, far, intermediate, or a hybrid of near and far as described further below.

Figure 7A:
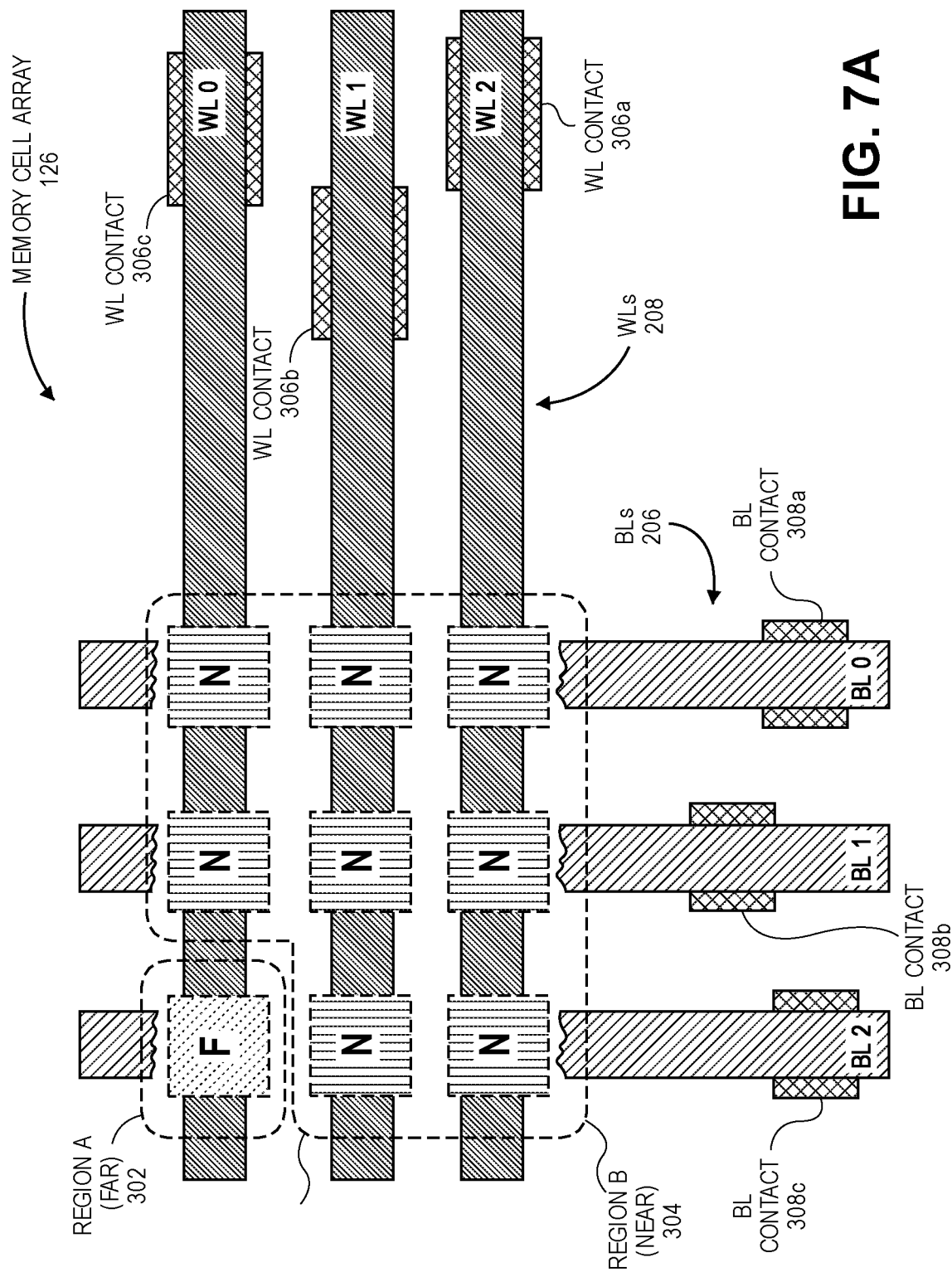
FIGS. 7A through 7C illustrate various cutaway plan views of a memory cell array formed in accordance with various examples described herein.
Figure 7B:
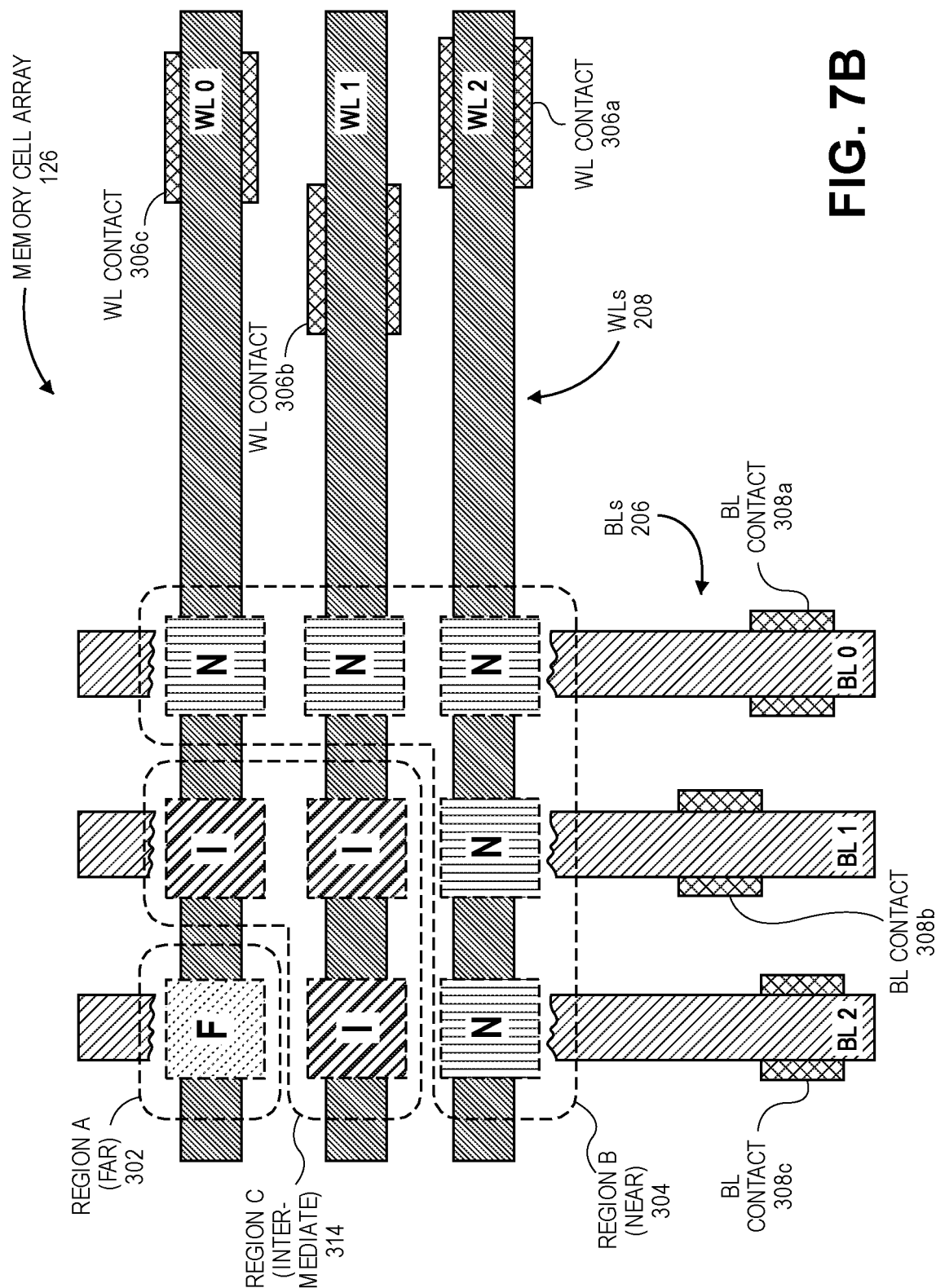
Figure 7C:
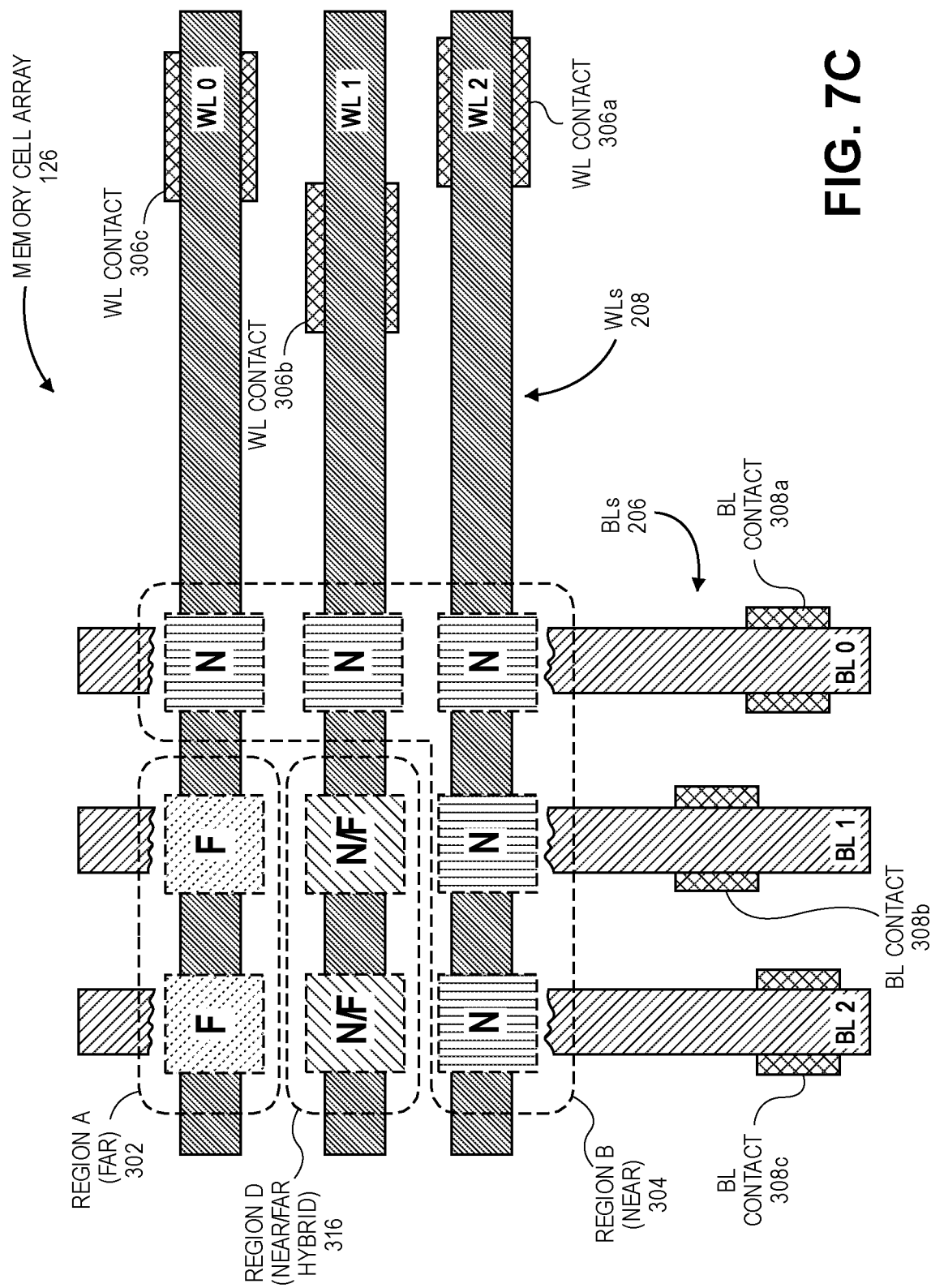

FIGS. 7A through 7C illustrate various cutaway plan views of a single memory cell array 126 formed in accordance with various examples described herein. In FIG. 7A, by way of example only and not limitation, a memory cell array 126 is shown with two variations on Region A 302 and Region B 304 first illustrated with reference to FIG. 3. For example, in FIG. 7A, Region A 302 encompasses a far memory cell "F" located more than two memory cells away from both the WL contacts 306a/306b/306c, as well as the BL contacts 308a, 308b, 308c. In contrast, Region B encompasses near memory cells determined to be within two memory cells of WL contacts 306a/306b/306c, as well as the BL contacts 308a, 308b, 308c.

In FIG. 7B, by way of example only and not limitation, a memory cell array 126 is shown with a third region, Region C, in addition to variations on Region A 302 and Region B 304 first illustrated with reference to FIG. 3. For example, in FIG. 7B, Region A 302 encompasses a far memory cell "F" located more than two memory cells away from both the WL contacts 306a/306b/306c, as well as the BL contacts 308a, 308b, 308c. In contrast, Region B encompasses near memory cells determined to be within one memory cell of WL contacts 306a/306b/306c, as well as the BL contacts 308a, 308b, 308c. The third region, Region C 314, is an intermediate region encompassing intermediate memory cells "I" determined to be greater than one memory cell away from WL contacts 306a/306b/306c, as well as the BL contacts 308a, 308b, 308c, but within two memory cells of those contacts. An intermediate region such as Region C 314 is determined when it would be advantageous to deposit an intermediate layer of material having a resistivity less than that used for the near memory cells in Region B but greater than that used for the far memory cells in Region A.

In one embodiment, when the distance threshold is different for the conductive BL than the distance threshold for the conductive WL, resistive materials having different levels of resistivity can be introduced in the formation of memory cells determined to be located in a far region of memory cells relative to BL contacts but a near region of memory cells relative to WL contact and vice versa. This results in the possibility of depositing two materials of different resistivity on the conductive lines on opposite sides of the near/far cell stack to further maintain current delivery and/or mitigate current spike throughout the memory cell array in accordance with a near and far region of the memory cell array, where near and far regions overlap.

Thus, in FIG. 7C, by way of example only and not limitation, a memory cell array 126 is shown with a fourth type of region, Region D, in addition to variations on Region A 302 and Region B 304 first illustrated with reference to FIG. 3. For example, in FIG. 7C, Region A 302 encompasses two far memory cells "F" located more than two memory cells away from the BL contacts 308a, 308b, 308c and more than one memory cell away from the WL contacts 306a/306b/306c. In contrast, Region B encompasses near memory cells determined to be within one memory cell of WL contacts 306a/306b/306c, as well as the BL contacts 308a, 308b, 308c. The fourth region, Region D 316, is a hybrid region encompassing memory cells "N/F" determined to be both near and far in that the memory cells are determined to be greater than one memory cell away from WL contacts 306a/306b/306c but exactly one memory cell away from the BL contacts 308a, 308b, 308c. The hybrid region such as Region D 316 is determined when it would be advantageous to deposit a layer of material having a higher resistivity along the BL coupled to the cell, and a different layer of material having a lower resistivity along the WL coupled to the cell, or vice versa. The examples of Regions in FIG. 7C also demonstrate that the threshold distances used to determine a region can be different for the WL contacts 306a/306b/306c than for the BL contacts 308a, 308b, 308c resulting in the hybrid N/F cells, such as those illustrated in FIGS. 6D and 6F.

In one embodiment, deposition of the layer of resistive materials includes introducing the resistive material into the memory cell array in a manner that modifies the resistance of one or more of the conductive lines during formation of the memory cell array, where the conductive lines include any of the BLs and WLs that form the grid into which the memory elements are arranged and to which the memory cells are coupled. In one embodiment the manner of introducing the resistive material includes depositing the resistive material at the coupling of the memory cell to the conductive line, i.e. along the conductive line coupled to the memory cell stack. In one embodiment the manner of introducing the resistive material includes incorporating the resistive material into the conductive line coupled to the memory cell stack.

In one embodiment, one or more additional types of resistive material having an intermediate level of resistivity can be introduced in the formation of memory cells to further maintain current delivery and/or mitigate current spike throughout the memory cell array. In one embodiment deposition of the one or more additional types of resistive material includes introducing the additional type of material during formation of an intermediate region of memory cells in the memory cell array, where the intermediate region is located between a near region of memory cells and a far region of memory cells.

In one embodiment, a photo mask defines the regions of the memory cell array based on a determined distance of each memory cell from any of the one or more contacts to a current source of the memory cell array, where the contacts are located at one end of the conductive lines that form the memory cell array. In one embodiment, each region spans neighboring memory cells that are located within the determined distance.

In one embodiment, the photo mask defines the boundary and dimension of each region based on the capacitance of the memory cell array and distance thresholds, where the distance thresholds include a threshold distance of memory cells from contacts located at one end of the conductive BLs, and another threshold distance of memory cells from contacts located at one end of the conductive WLs, where the conductive WLs are orthogonal to the conductive BLs. In one embodiment the distance thresholds are the same and in other embodiments the distance threshold for contacts located on a conductive BL may be greater than the distance threshold for contacts located on a conductive WL and vice versa.

Figure 8:
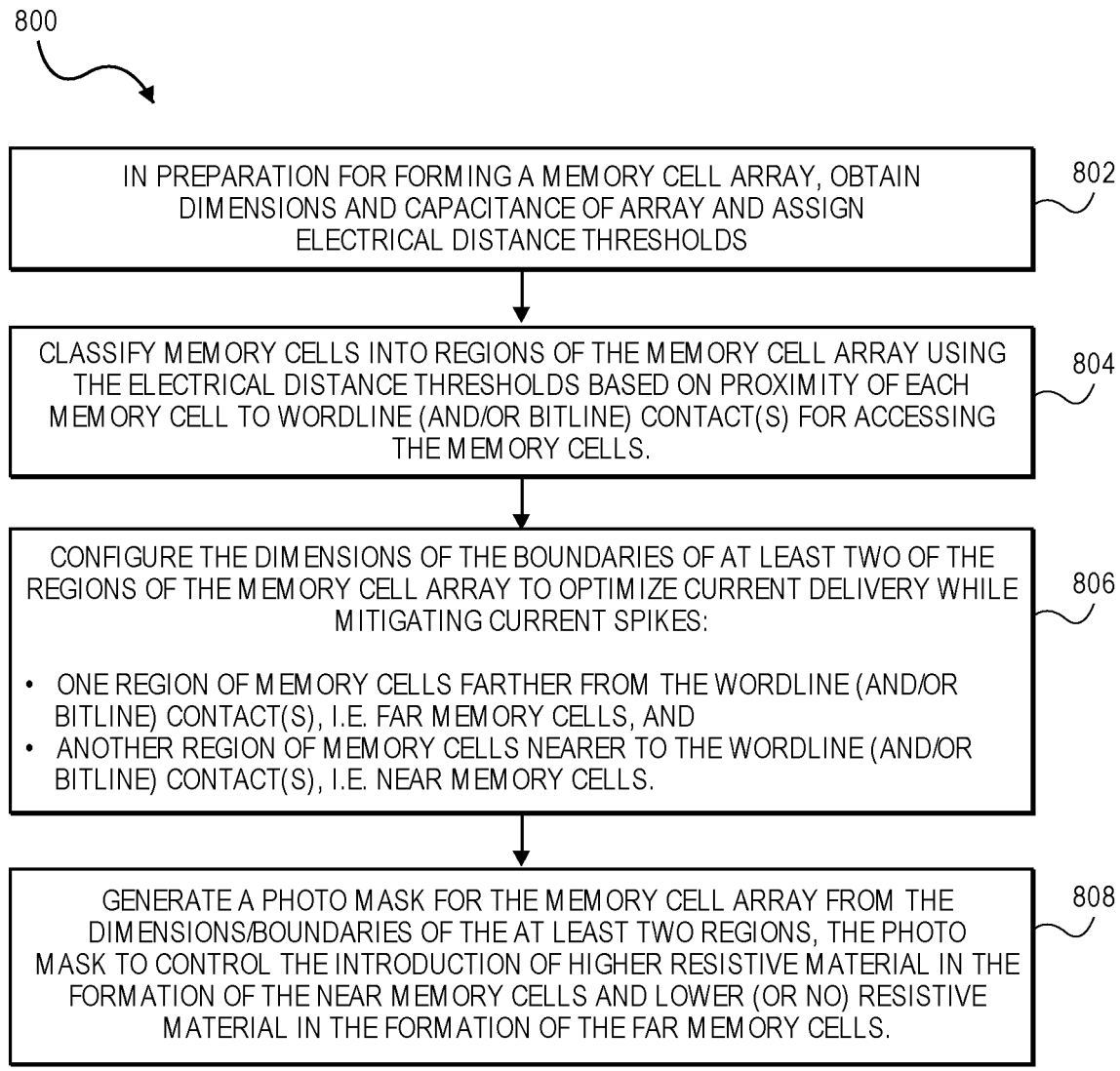
FIGS. 8-9 are flow diagrams of a method of forming a memory cell array in accordance with various examples described herein.
Figure 9:
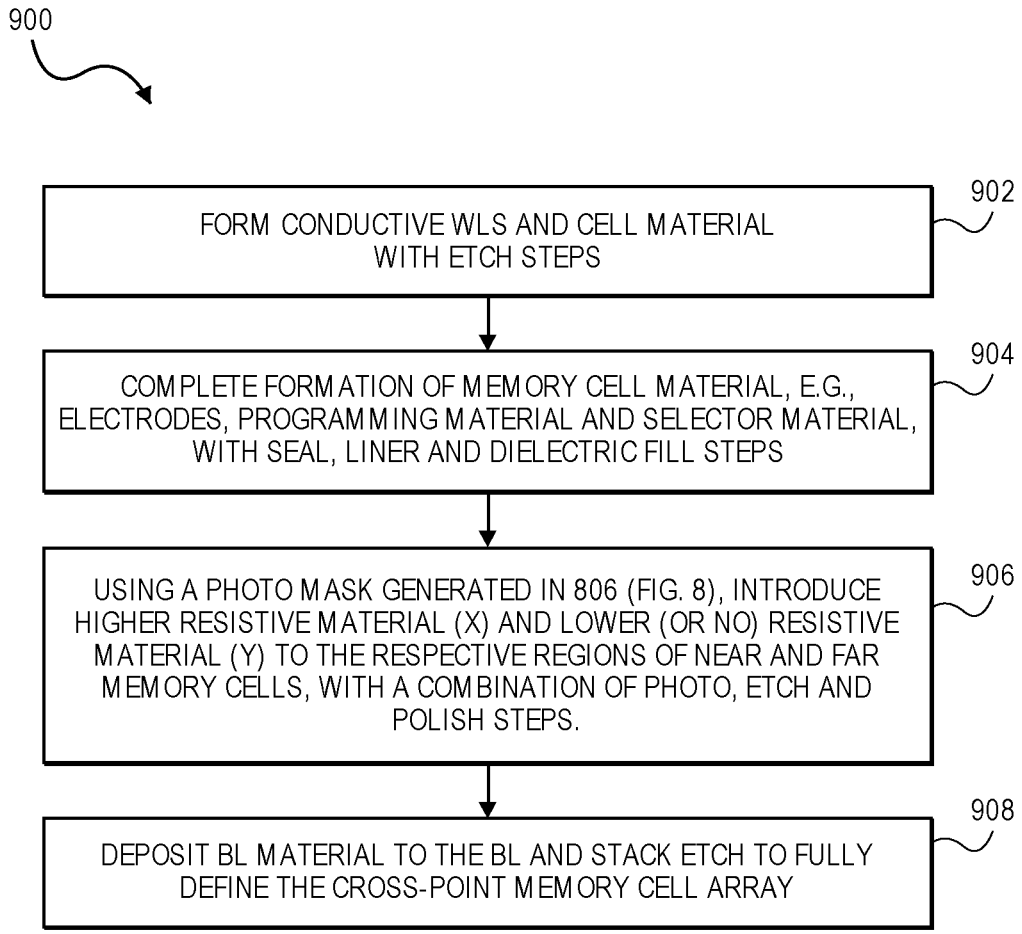

FIGS. 8 and 9 are flow diagrams of a method of forming a memory cell array 126 in accordance with an embodiment. The methods, processes and logic depicted in FIGS. 8 and 9 can comprise hardware (e.g. circuitry, dedicated logic, controllers, etc.), software (such as is run on a general-purpose computer system or a dedicated machine, e.g. a software module or logic), and interfaces (such as a memory interface) between hardware and software, or a combination of both. Although the processes and logic are described below in terms of some sequential operations, it should be appreciated that some of the operations described can be performed in a different order. Moreover, some operations can be performed in parallel rather than sequentially.

Figure 10:
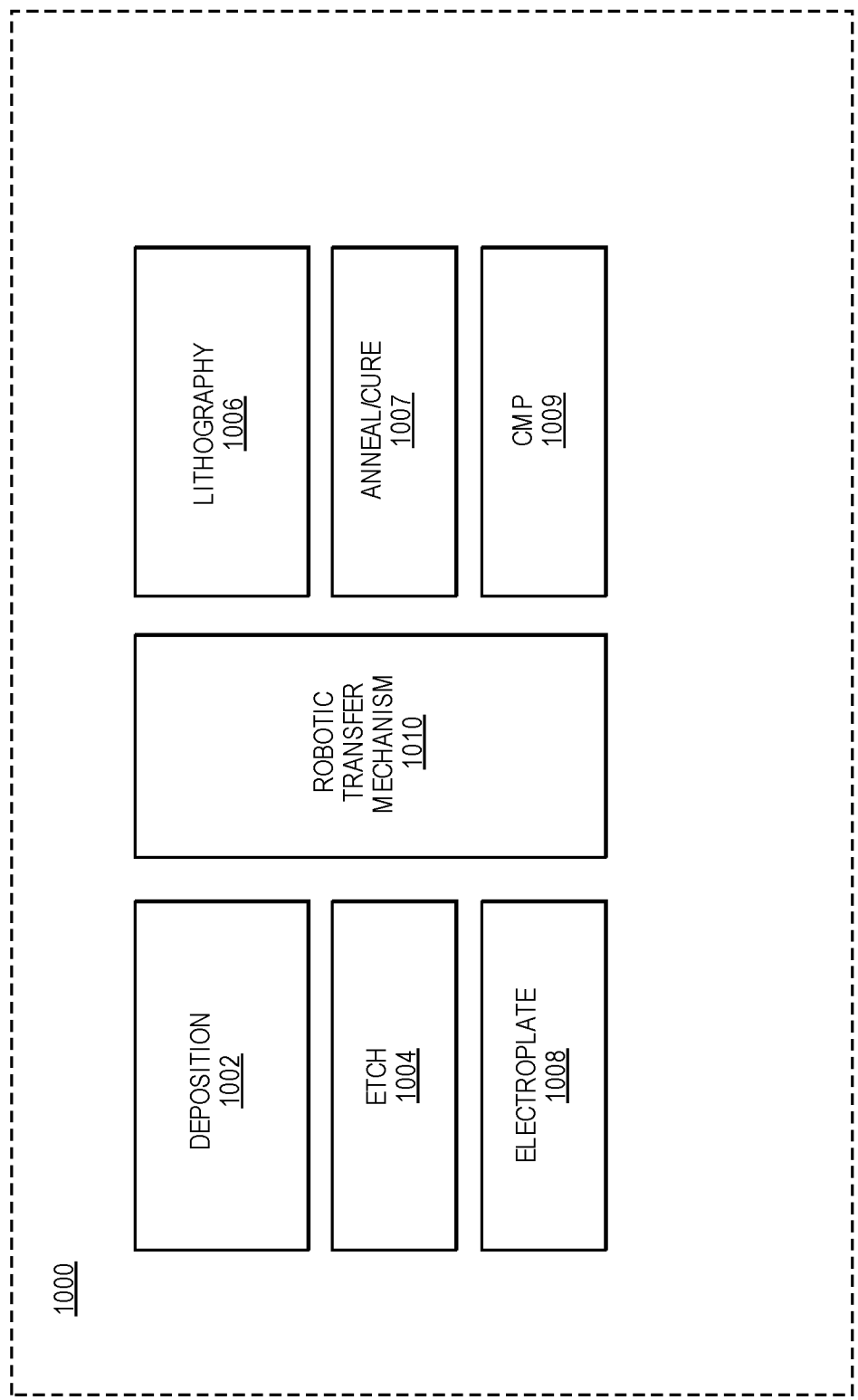
FIG. 10 is a schematic block diagram of exemplary processing equipment for fabricating a memory cell array in accordance with various examples described herein.

The process of FIGS. 8 and 9 can be used to form an array of memory cells, such as the memory cell array 126 introduced in FIG. 1 and as further illustrated in the examples depicted in the preceding figures. The operations of the processes can be performed by processing equipment capable of performing techniques such as deposition, lithography, and etching. FIG. 10, described below, illustrates an example of processing equipment for performing the operations of the processes.

Referring to FIG. 8, in the illustrated embodiment, the process 800 begins at process 802 with preparing to form a memory cell array by obtaining the dimensions and capacitance of the memory cell array 126 and assigning the electrical distance thresholds used to determine the types of regions encompassing each memory cell in the array, where the thresholds specify the distance of a cell from a wordline (or bitline contact) for accessing the memory cell, such as WL contacts 306a/306b/306c and BL contacts 308a, 308b, 308c.

At process 804, the process classifies the memory cells into at least two regions based on the distance thresholds. At process 806, the process configures the dimensions of the boundaries of the at least two regions to encompass all or a portion of the memory cell array to optimize current delivery while mitigating current spikes. The at least two regions include one region of memory cells farther from the wordline (or bitline) contact, i.e. the "far memory cells," and another region of memory cells nearer to the wordline (or bitline) contact, i.e. the "near memory cells." In some embodiments, the regions include a region of intermediate memory cells located between the regions of near and far memory cells, as well as a regions of hybrid memory cells determined to be near the bitline contacts and far from the wordline contacts, and vice versa.

The process 800 continues at 808 to generate a photo mask for the memory cell array from the dimensions/boundaries of the at least two regions, the photo mask to control the introduction of higher resistive material in the formation of the near memory cells and lower (or no) resistive material in the formation of the far memory cells. Depending on the architecture of the memory cell array, such as a three-dimensional memory array structure formed from memory cell arrays stacked in layers, some memory cell arrays can have lower or higher resistance in the current paths for accessing memory cells and some layers of memory cell arrays can also have different array capacitance (which can affect spike). These characteristics in combination with the distances of the memory cells relative to the wordline and bitline contacts, e.g., WL contacts 306a/306b/306c, as well as the BL contacts 308a, 308b, 308c, aid in determining the optimal dimensions/boundaries of the at least two regions from which the photo mask is generated. In one embodiment, any one or more of the multiple layers of memory cell arrays of a three-dimensional memory array structure can be formed using a different photo mask defining regions having different boundaries and dimensions than photo masks used to form the other layers of the three-dimensional memory array structure.

With reference to FIG. 9, the process 900 of forming the memory cell array using the generated photo mask begins at process 902 to form conductive WLs and cell material with etch steps. During formation of the memory cell array a layer of resistive material is introduced into the memory cell array by being deposited through the generated photo mask on one or more of the BL and WL conductive lines to which the memory cells are coupled. At 904, the process 900 completes the formation of memory cell material, e.g., electrodes, programming material and selector material, with seal, liner and dieletric fill steps. Throughout the description that follows, note that the conductive WLs (or BLs) can include a layer of conductive material that is to be patterned to form electrodes (e.g., electrodes 508a/508b/508c of FIG. 5). Further, when a layer is formed "over" another layer, the stack of materials from which the memory cells are composed can include one or more intervening layers. For example, a conductive electrode layer can be located directly on the conductive WLs, or on one or more layers (e.g., other conductive and resistive layers) along the conductive WLs, such as the layers of higher and lower resistivity materials introduced at 906 below. Processing equipment can employ any suitable process for forming the conductive layers and resistive layers for the WLs, BLs and electrodes, such as electroplating, physical vapor deposition (PVD), chemical vapor deposition, or other process for forming conductive and resistive layers.

At 906, the process 900 continues using the photo mask generated at 808 (FIG. 8), by introducing higher resistive material (X) and lower (or no) resistive material (Y) to the respective regions of near and far memory cells, including, in some cases, an intermediate resistive material (Z) to an intermediate region of memory cells located between the near and far memory cells or, in some cases, a hybrid region of near and far memory cells in which different combinations of resistive material are deposited on opposite sides of the memory cell stack, e.g., FIGS. 6D and 6F, and in Region D of FIG. 7C. In one embodiment, the introduction of the resistive materials is completed using a combination of photo etch and polish steps.

In one embodiment, the introduction of the resistive materials at 906 can occur twice, once at the coupling of the WL to the memory cell material and again at the coupling of the memory cell material to the BL. In one embodiment, the level of resistivity of the resistive material deposited at the coupling of the WL to the memory cell material can be the same or different from the level of resistivity of the resistive material deposited at the coupling of the memory cell material to the BL. In other words, both deposited materials may be higher resistivity material or both may be lower resistivity material, or one can be higher resistivity material while the other is lower resistivity material, depending on the boundaries and dimensions of the respective regions defined in the photo masks generated in FIG. 8.

At 908, the process 900 of forming the memory cell array concludes with forming the conductive bitlines by depositing the conductive BL material over the resistive material and electrode layers and patterning the assembled materials using stack etching to fully define the memory cell array. In this manner, the resistance of current paths in the memory cell array are optimized to mitigate spikes in a region of near memory cells while enabling better current delivery to a region of far memory cells.

In one embodiment, the process 900 illustrated in FIG. 9, involves patterning the electrode layers, programming, selector and resistive materials to form separate electrodes, programming elements, selector elements, and a layer of resistivity in accordance with the various examples described herein. Patterning the layers can include processing techniques such as deposition and patterning of a photo mask, such as the photo mask generated with reference to FIG. 8, and etching through gaps in the patterned mask to pattern the underlying layers of materials, including the layer(s) of resistive materials, e.g. the higher resistive material X and lower resistive material Y. In one embodiment, processing equipment employs a multiple patterning process, such as self-aligned double patterning (SADP) or other multiple patterning process. Different or additional processing operations are also possible.

Although the process 800/900 illustrates embodiments in which higher and lower resistivity materials are introduced in the formation of memory cells at the coupling to both the BLs and WLs, some embodiments may include introducing any of the higher and lower resistivity materials at the coupling of only the BL or only the WL, such as illustrated in FIGS. 6A, 6B, 6G and 6H or in the lower stacks illustrated in FIGS. 6I and 6J. Other combinations of depositing resistive material may be used to mitigate spike while maintaining current delivery to each memory cell stack in a memory cell array 126.

FIG. 10 is a block diagram of exemplary processing equipment for fabricating a memory cell array in accordance with embodiments described herein. Processing equipment 1000 can include tools to perform materials processing operations such as deposition, etching (e.g., wet or dry etching, laser etching, or other etch processes), ion implantation, chemical mechanical planarization (CMP), annealing, curing, cleaning, and/or other materials processing operations. As illustrated, processing equipment 1000 includes a deposition tool 1002, in accordance with embodiments. Although one deposition tool 1002 is illustrated, other embodiments can include more than one deposition tool. Deposition tool 1002 can include, for example, equipment to perform chemical vapor deposition (CVD), atomic layer deposition (ALD), physical vapor deposition (PVD) such as physical sputtering, plasma-enhanced chemical vapor deposition (PECVD), hybrid physical chemical vapor deposition (HPCVD), or other deposition techniques. Deposition tool 1002 can deposit one or more of the layers described herein to form a memory cell array. Processing equipment 1000 can also include an electroplating tool 1008 to form conductive layers via an electroplating or electrodeposition process.

Processing equipment 1000 also includes an etch tool or chamber 1004, for example, a wet or dry etch tool. Wet etching can involve, for example, immersing the substrate being processed in a wet etchant, or other wet etching technique. Dry etching can involve, for example, the removal of material by exposing the substrate to bombardment of ions (e.g., via a plasma of reactive gases) that dislodge portions of the material from surfaces of the substrate that are exposed to the ions. Although one etch tool 1004 is illustrated, other embodiments can include more than one etch tool. Etch tool 1004 can perform etching or patterning operations of methods described herein.

Processing equipment 1000 also includes lithography tool 1006. Lithography tool 1006 can use light to transfer a pattern from a photomask to a light-sensitive chemical "photoresist" on the substrate. Subsequent operations, such as chemical treatments, can then etch the pattern into the material under the photoresist, or enable deposition of a new material in the pattern. Processing equipment also includes an annealing and/or curing tool 1007. Annealing/curing tool 1007 can include a furnace or other heating mechanism to anneal or cure layers on a substrate.

Processing equipment also includes CMP tool 1009. CMP tool 1009 can perform chemical mechanical planarization operations by using, for example, a chemical slurry to planarize a surface of a substrate. The tools of processing equipment can be combined into a single tool, can be separate tools. In another embodiment, some tools are combined while others are separate. Robotic transfer mechanisms 1010 can transfer the substrate or wafer being processed amongst tools.

Processing equipment includes control logic to operate the equipment and control parameters of the process. In one embodiment, each tool includes its own control logic. The control logic can include hardware logic and/or software/firmware logic to control the processing. The equipment can be programmed or configured to perform certain operations in a certain order. For example, a manufacturing entity can configure processing equipment 1000 to perform operations on a wafer or substrate to form electronic circuits. The processing equipment can also include other components of a computer system, such one or more components of system 1100 of FIG. 11. For example, in one embodiment, processing equipment can include one or more displays and input devices for managing the processing equipment. A manufacturing entity typically operates the processing equipment.

Figure 11:
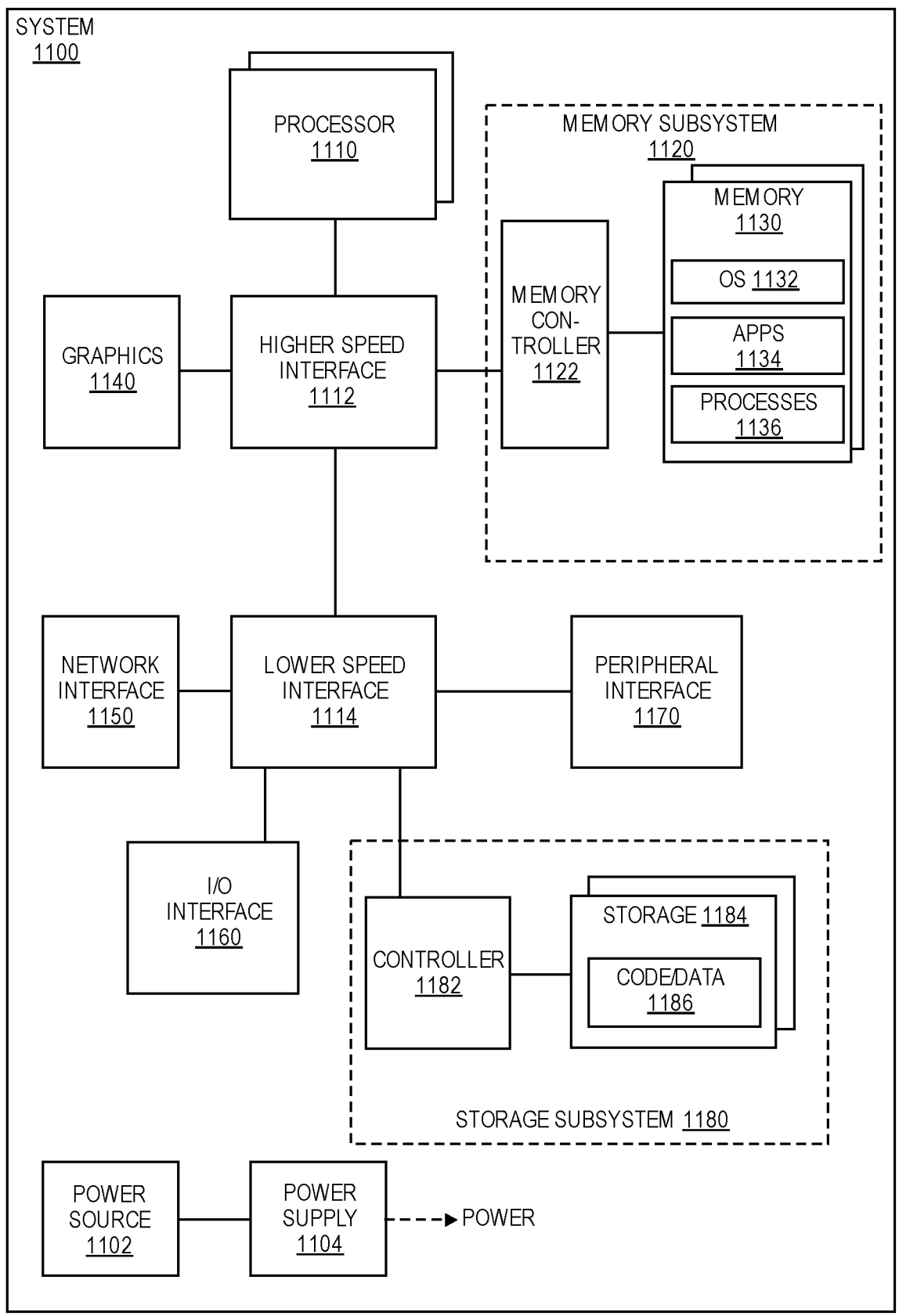
FIG. 11 is a schematic block diagram of a computing system in which a memory cell array formed in accordance with various examples described herein can be included.

FIG. 11 is a block diagram of a computing system in which a memory device having a memory cell array incorporating higher and lower resistivity materials can be included, in accordance with an embodiment.

System 1100 represents a computing device in accordance with any embodiment described herein, and can be a laptop computer, a desktop computer, a server, a gaming or entertainment control system, a scanner, copier, printer, routing or switching device, embedded computing device, or other electronic device.

System 1100 includes processor 1110, which provides processing, operation management, and execution of instructions for system 1100. Processor 1110 can include any type of microprocessor, central processing unit (CPU), graphics processing unit (GPU), processing core, or other processing hardware to provide processing for system 1100, or a combination of processors. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1100 includes interface 1112 coupled to processor 1110, which can represent a higher speed interface or a high throughput interface for system components that needs higher bandwidth connections, such as memory subsystem 1120 or graphics interface components 1140. Interface 1112 can represent a "north bridge" circuit, which can be a standalone component or integrated onto a processor die. Graphics interface 1140 interfaces to graphics components for providing a visual display to a user of system 1100. In one embodiment, graphics interface 1140 generates a display based on data stored in memory 1130 or based on operations executed by processor 1110 or both.

Memory subsystem 1120 represents the main memory of system 1100 and provides storage for code to be executed by processor 1110, or data values to be used in executing a routine. Memory subsystem 1120 can include one or more memory devices 1130 such as read-only memory (ROM), flash memory, one or more varieties of random access memory (RAM), or other memory devices, or a combination of such devices.

Memory devices 1130 can include memory devices having memory cell arrays incorporating higher and lower resistivity materials as described herein. For example, memory devices 1130 can include a non-volatile memory (NVM) device containing memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place 3D cross-point memory device, or other byte addressable write-in-place NVM devices (also referred to as persistent memory), such as single or multi-level phase change memory or phase change memory with a switch, NVM devices that use chalcogenide phase change material (for example, chalcogenide glass), other types of resistive memory including metal oxide base, oxygen vacancy base and conductive bridge random access memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a domain wall and spin orbit transfer based device, a thyristor based memory device, or a combination of any of the above, or other types of memory.

Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide logic to provide functions for system 1100. In one embodiment, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 1100 includes interface 1114, which can be coupled to interface 1112. Interface 1114 can be a lower speed interface than interface 1112. In one embodiment, interface 1114 can be a "south bridge" circuit, which can include standalone components and integrated circuitry. In one embodiment, multiple user interface components or peripheral components, or both, couple to interface 1114. Network interface 1150 provides system 1100 the ability to communicate with remote devices (e.g., servers or other computing devices) over one or more networks. Network interface 1150 can include an Ethernet adapter, wireless interconnection components, USB (universal serial bus), or other wired or wireless standards-based or proprietary interfaces. Network interface 1150 can exchange data with a remote device, which can include sending data stored in memory or receiving data to be stored in memory.

In one embodiment, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 can include any hardware interface not specifically mentioned above. Peripherals refer generally to devices that connect dependently to system 1100. A dependent connection is one where system 1100 provides the software platform or hardware platform or both on which operation executes, and with which a user interacts.

In one embodiment, system 1100 includes storage subsystem 1180 to store data in a nonvolatile manner. In one embodiment, in certain system implementations, at least certain components of storage 1180 can overlap with components of memory subsystem 1120. Storage subsystem 1180 includes storage device(s) 1184, which can be or include any conventional medium for storing large amounts of data in a nonvolatile manner, such as one or more magnetic, solid state, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 can include volatile memory (i.e., the value or state of the data is indeterminate if power is interrupted to system 1100). In one embodiment, storage subsystem 1180 includes controller 1182 to interface with storage 1184. In one embodiment controller 1182 is a physical part of interface 1114 or processor 1110, or can include circuits or logic in both processor 1110 and interface 1114.

Power source 1102 provides power to the components of system 1100. More specifically, power source 1102 typically interfaces to one or multiple power supplies 1104 in system 1100 to provide power to the components of system 1100. In one embodiment, power supply 1104 includes an AC to DC (alternating current to direct current) adapter to plug into a wall outlet. Such AC power can be renewable energy (e.g., solar power) power source 1102. In one embodiment, power source 1102 includes a DC power source, such as an external AC to DC converter. In one embodiment, power source 1102 or power supply 1104 includes wireless charging hardware to charge via proximity to a charging field. In one embodiment, power source 1102 can include an internal battery or fuel cell source.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Numerous specific details of the above-described embodiments provide a thorough explanation of the methods, media, apparatus, processes and systems for current delivery and spike mitigation in a memory cell array. It will be apparent, however, to one skilled in the art, that an embodiment can be practiced without one or more of these specific details. In other instances, well-known components, structures, and techniques have not been shown in detail so as to not obscure the understanding of this description.

Reference in the specification to "one embodiment" or "an embodiment" means that a particular feature, structure, or characteristic described in connection with the embodiment can be included in at least one embodiment. The appearances of the phrase "in one embodiment" in various places in the specification do not necessarily all refer to the same embodiment.

Examples of an apparatus, system and method are described herein for a memory cell array formed to optimize a resistance of a current path through a selected memory cell in the memory cell array. The apparatus, system and method are configured to mitigate current spike in some memory cell(s) during selection by forming the memory cell in a manner that increases resistance of the current path. The apparatus, method and system are further configured to maintain current delivery to other memory cell(s) to maintain a steady state current of the selected memory cell at or above a hold current by forming the memory cell in a manner that decreases resistance of the current path. The apparatus, method and system are configured to generate a photo mask through which resistive materials are deposited on one or more of the conductive lines coupled to the memory cells based on the distance from the memory cells to the contacts on the conductive lines, where the contacts connect to a current source for accessing memory cells in the memory cell array. The deposited layer of resistive materials facilitate increasing a resistance of the current path when accessing memory cells vulnerable to current spike, i.e., near memory cells, while decreasing the resistance of the current path to preserve current delivery to other memory cells, i.e., far memory cells. The system and method are configured to increase and decrease a resistance of the current path for accessing a selected memory cell as needed based on the memory cell locations relative to the BL and WL contacts with which the memory cell array is coupled to a power source.

Additional example implementations are as follows:

Example 1 is a method, system, apparatus or computer-readable medium for a circuit that includes first conductive lines in a first orientation in a plane parallel to second conductive lines in a second orientation, where the first conductive lines overlapping the second conductive lines to form cross points, memory cells coupled to the first and second conductive lines at the cross points, near memory cells near to contacts at an end of any of the first and second conductive lines and far memory cells far from the contacts, a high resistive material along any of the first and second conductive lines at a cross point of a near memory cell, the high resistive material to increase a resistance of a current path for the near memory cell, and a low resistive material along any of the first and second conductive lines at a cross point of a far memory cell, the low resistive material to reduce a resistance of the current path for the far memory cell.

Example 2 is the method, system, apparatus or computer-readable medium of Example 1 where the contacts at the end of any of the first and second conductive lines connect to a current source for accessing the memory cells.

Example 3 is any of the method, system, apparatus or computer-readable medium of Example 1 or Example 2, where near memory cells are near to first contacts at ends of the first conductive lines and far memory cells are far from the first contacts, the high resistive material along any one of the second conductive lines at the cross points of the near memory cells and a near portion of the first conductive lines at the cross points of the near memory cells, and the low resistive material along any one of the second conductive lines at the cross points of the far memory cells and a far portion of the first conductive lines at the cross points of the far memory cells.

Example 4 is any of the method, system, apparatus or computer-readable medium of Example 1, 2 or 3, where near memory cells are near to first contacts at ends of the first conductive lines and to second contacts at ends of the second conductive lines, far memory cells are far from the first contacts and the second contacts, the high resistive material along any of the first and the second conductive lines at the cross points of the near memory cells, and the low resistive material along any of the first and the second conductive lines at the cross points of the far memory cells.

Example 5 is any of the method, system, apparatus or computer-readable medium of Example 1, 2, 3 or 4 where the high resistive material along a near portion of any of the first and the second conductive lines at the cross points of the near memory cells, and the low resistive material along a far portion of any of the first and the second conductive lines at the cross points of the far memory cells.

Example 6 is any of the method, system, apparatus or computer-readable medium of Example 1, 2, 3, 4 or 5, where the circuit further includes intermediate memory cells farther from the contacts relative to near memory cells but nearer to the contacts relative to the far memory cells, and an intermediate resistive material along any of the first and second conductive lines at a cross point of an intermediate memory cell, the intermediate resistive material to decrease a resistance of a current path for the intermediate memory cell relative to the near memory cell and to increase the resistance of the current path for the intermediate memory cell relative to the far memory cell.

Example 7 is any of the method, system, apparatus or computer-readable medium of Example 1, 2, 3, 4, 5 or 6, where the circuit further includes hybrid memory cells near to first contacts at ends of the first conductive lines and far from second contacts at ends of the second conductive lines, the high resistive material along any of the first conductive lines at the cross points of the hybrid memory cells, and the low resistive material along any of the second conductive lines at the cross points of the hybrid memory cells.

Example 8 is any of the method, system, apparatus or computer-readable medium of Example 1, 2, 3, 4, 5, 6 or 7, where the first conductive lines are wordlines and the second conductive lines are bitlines, or conversely where the first conductive lines are bitlines and the second conductive lines are wordlines.

Example 9 is any of the method, system, apparatus or computer-readable medium of Example 1, 2, 3, 4, 5, 6, 7 or 8 where the memory cells coupled to the first and second conductive lines at the cross points form a single memory array, the single memory array and a second memory array coupled to a three-dimensional memory array structure, and cross points of the near and far memory cells are any of comparable to or different from the cross points of the near and far memory cells of the second memory array, depending on any one or more of an array capacitance of the single memory array compared to the array capacitance of the second memory array, and a resistance of the contacts in the single memory array compared to the resistance of the contacts in the second memory array.

Example 10 is any of the method, system, apparatus or computer-readable medium of Example 1, 2, 3, 4, 5, 6, 7, 8 or 9, where any of the high resistive material and intermediate resistive material is any of a metal nitride, including tungsten nitride (WN) and a metal silicide, including any of tungsten silicide nitride (WSiN), and titanium silicon nitride (TiSiN), and the low resistive material is a metal, the metal including any of titanium (Ti) and tungsten (W) metals.

Example 11 is any of the method, system, apparatus or computer-readable medium of Example 1, 2, 3, 4, 5, 6, 7, 8, 9 or 10 where the memory cells are composed of a memory material that enables accessing a value stored in the memory cell, the memory material including any of a single-level phase change material, a multi-level phase change memory material, a phase change memory material with a switch, a chalcogenide phase change material including chalcogenide glass, a resistive memory material including metal oxide base, oxygen vacancy base, a conductive bridge random access memory material, ferroelectric transistor random access memory, magnetoresistive random access memory, memory that incorporates memristor technology and spin transfer torque memory.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit comprising:
   first conductive lines in a first orientation in a plane parallel to second conductive lines in a second orientation, the first conductive lines overlapping the second conductive lines to form cross points;
   first contacts disposed at one end of any of the first conductive lines and second contacts disposed at one end of any of the second conductive lines, the first contacts and the second contacts to connect to a current source for accessing memory cells coupled to the first conductive lines and the second conductive lines at the cross points;
   the memory cells including near memory cells, near to any of the first contacts and the second contacts and vulnerable to a spike in current delivery interfering with accessing the memory cells, and far memory cells, far from any of the first contacts and the second contacts and vulnerable to a drop in current delivery interfering with accessing the memory cells;
   a high resistive material along any one or both of the first conductive lines coupled to one or more of the near memory cells and the second conductive lines coupled to one or more of the near memory cells, the high resistive material to increase a resistance of a current path for the one or more of the near memory cells to mitigate the spike in current delivery; and
   a low resistive material along any one or both of the first conductive lines coupled to one or more of the far memory cells and the second conductive lines coupled to one or more of the far memory cells, the low resistive material to reduce the resistance of the current path for the one or more of the far memory cells to preserve current delivery.

2. The circuit of claim 1, wherein:
the high resistive material along any of:
the second conductive lines coupled to one or more of the near memory cells, and a near portion of the first conductive lines coupled to one or more of the near memory cells, the near portion near to the first contacts; and
the low resistive material along any of:
the second conductive lines coupled to one or more of the far memory cells, and a far portion of the first conductive lines coupled to one or more of the far memory cells, the far portion far from the first contacts.

3. The circuit of claim 1, wherein:
the high resistive material along any of the first conductive lines and the second conductive lines coupled to one or more of the near memory cells; and
the low resistive material along any of the first and the second conductive lines coupled to one or more of the far memory cells.

4. The circuit of claim 3, wherein:
the high resistive material along a near portion of any of the first conductive lines and the second conductive lines coupled to one or more of the near memory cells; and
the low resistive material along a far portion of any of the first conductive lines and the second conductive lines coupled to one or more of the far memory cells.

5. The circuit of claim 1, the circuit further comprising intermediate memory cells farther from any of the first contacts and the second contacts relative to near memory cells but nearer to any of the first contacts and the second contacts relative to the far memory cells; and
an intermediate resistive material along any of the first conductive lines and second conductive lines coupled to one or more of the intermediate memory cells, the intermediate resistive material to decrease a resistance of a current path for the intermediate memory cell relative to the near memory cell and to increase the resistance of the current path for the intermediate memory cell relative to the far memory cell.

6. The circuit of claim 1, further comprising:
hybrid memory cells near to first contacts but far from second contacts;
the high resistive material along any of the first conductive lines coupled to any of the hybrid memory cells; and
the low resistive material along any of the second conductive lines coupled to any of the hybrid memory cells.

7. The circuit of claim 1, wherein any one of:
the first conductive lines are wordlines and the second conductive lines are bitlines; and
the first conductive lines are bitlines and the second conductive lines are wordlines.

8. The circuit of claim 1, wherein the memory cells coupled to the first conductive lines and the second conductive lines form a single memory array, the single memory array and a second memory array coupled to a three-dimensional memory array structure; and
wherein cross points of the near memory cells and the far memory cells are any of comparable to or different from the cross points of the near memory cells and the far memory cells of the second memory array, depending on any one or more of:
an array capacitance of the single memory array compared to the array capacitance of the second memory array, and
a resistance of the first contacts and the second contacts in the single memory array compared to the resistance of the first contacts and the second contacts in the second memory array.

9. The circuit of claim 1, wherein:
any of the high resistive material is any of a metal nitride, including tungsten nitride (WN) and a metal silicide, including any of tungsten silicide nitride (WSiN), and titanium silicon nitride (TiSiN); and
the low resistive material is a metal, the metal including any of titanium (Ti) and tungsten (W) metals.

10. The circuit of claim 1, wherein the memory cells are composed of a memory material that enables accessing a value stored in the memory cell, the memory material including any of a single-level phase change material, a multi-level phase change memory material, a phase change memory material with a switch, a chalcogenide phase change material including chalcogenide glass, a resistive memory material including metal oxide base, oxygen vacancy base, a conductive bridge random access memory material, ferroelectric transistor random access memory, magnetoresistive random access memory, memory that incorporates memristor technology and spin transfer torque memory.

11. A system comprising:
a processor;
a memory device communicatively coupled with the processor, the memory device including an array of memory cells comprising:
first conductive lines in a first orientation in a plane parallel to second conductive lines in a second orientation, the first conductive lines overlapping the second conductive lines to form cross points;
first contacts disposed at one end of any of the first conductive lines and second contacts disposed at one end of any of the second conductive lines, the first contacts and the second contacts to connect to a current source for accessing memory cells coupled to the first conductive lines and the second conductive lines at the cross points;
the memory cells including near memory cells, near to any of the first contacts and the second contacts and vulnerable to a spike in current delivery interfering with accessing the memory cells, and far memory cells, far from any of the first contacts and the second contacts and vulnerable to a drop in current delivery interfering with accessing the memory cells;
a high resistive material along any one or both of the first conductive lines coupled to one or more of the near memory cells and the second conductive lines coupled to one or more of the near memory cells, the high resistive material to increase a resistance of a current path for the one or more of the near memory cells to mitigate the spike in current delivery; and
a low resistive material along any one or both of
the first conductive lines coupled to one or more of the far memory cells and the second conductive lines coupled to one or more of the far memory cells, the low resistive material to reduce the resistance of the current path for the one or more of the far memory cells to preserve current delivery.

12. The system of claim 11, wherein:
the high resistive material along any of:
the second conductive lines coupled to any one or more of the near memory cells, and
a near portion of the first conductive lines coupled to one or more of the near memory cells, the near portion near to the first contacts; and
the low resistive material along any of:
the second conductive lines coupled to one or more of the far memory cells, and
a far portion of the first conductive lines coupled to one or more of the far memory cells, the far portion far from the first contacts.

13. The system of claim 12, further comprising:
the high resistive material along a near portion of any of the first conductive lines and the second conductive lines coupled to one or more of the near memory cells; and
the low resistive material along a far portion of any of the first conductive lines and the second conductive lines coupled to one or more of the far memory cells.

14. The system of claim 11, wherein:
the high resistive material along any of the first conductive lines and the second conductive lines coupled to any of the near memory cells; and
the low resistive material along any of the first conductive lines and the second conductive lines coupled to any of the far memory cells.

15. The system of claim 11, further comprising
intermediate memory cells farther from any of the first contacts and the second contacts relative to near memory cells but nearer to any of the first contacts and the second contacts relative to the far memory cells; and
an intermediate resistive material along any of the first conductive lines and second conductive lines coupled to one or more of the intermediate memory cells, the intermediate resistive material to decrease a resistance of a current path for the intermediate memory cell relative to the near memory cell and to increase the resistance of the current path for the intermediate memory cell relative to the far memory cell.

16. The system of claim 11, further comprising:
hybrid memory cells near to first contacts but far from second contacts;
the high resistive material along any of the first conductive lines coupled to any of the hybrid memory cells; and
the low resistive material along any of the second conductive lines coupled to any of the hybrid memory cells.

17. The system of claim 11, wherein any one of:
the first conductive lines are wordlines and the second conductive lines are bitlines; and
the first conductive lines are bitlines and the second conductive lines are wordlines.

18. The system of claim 11, wherein the memory cells coupled to the first conductive lines and the second conductive lines form an array of memory cells, the array of memory cells and a second array of memory cells coupled to a three-dimensional memory array structure; and
wherein cross points of the near memory cells and the far memory cells are any of comparable to or different from the cross points of the near memory cells and the far memory cells of the second array of memory cells, depending on any one or more of:
an array capacitance of the array of memory cells compared to the array capacitance of the second array of memory cells, and
a resistance of the first contacts and the second contacts in the array of memory cells compared to the resistance of the first contacts and the second contacts in the second array of memory cells.

19. The system of claim 11, wherein:
any of the high resistive material is any of a metal nitride, including tungsten nitride (WN) and a metal silicide, including any of tungsten silicide nitride (WSiN), and titanium silicon nitride (TiSiN); and
the low resistive material is a metal, the metal including any of titanium (Ti) and tungsten (W) metals.

20. The system of claim 11, wherein the memory cells in the memory array are composed of a memory material that enables accessing a value stored in the memory cell, the memory material including any of a single-level phase change material, a multi-level phase change memory material, a phase change memory material with a switch, a chalcogenide phase change material including chalcogenide glass, a resistive memory material including metal oxide base, oxygen vacancy base, a conductive bridge random access memory material, ferroelectric transistor random access memory, magnetoresistive random access memory, memory that incorporates memristor technology and spin transfer torque memory.

21. A circuit comprising an array of memory cells, the circuit further comprising:
a memory material coupled to a conductive material to access a value stored in a memory cell in the array of memory cells, an upper surface of the memory material coupled to a first conductive material and a lower surface of the memory material coupled to a second conductive material;
first contacts disposed at one end of any of first conductive lines and second contacts disposed at one end of any of second conductive lines, the first conductive lines and the second conductive lines formed from the respective first conductive materials and the second conductive materials, the first contacts and the second contacts to connect to a current source to access the value stored in the memory cell in the array of memory cells;
the array of memory cells including one or more near memory cells, near to any of the first contacts and the second contacts and vulnerable to a spike in current delivery interfering with access to the value, and one or more far memory cells, far from any of the first contacts and the second contacts and vulnerable to a drop in current delivery interfering with access to the value;
high resistive material on any of the first conductive lines and the second conductive lines coupled to one or more of the near memory cells, the high resistive material to increase a resistance of a current path for the near memory cells; and
low resistive material on any of the first conductive lines and second conductive lines coupled to one or more of the far memory cells, the low resistive material to reduce a resistance of the current path for the far memory cells.

22. The circuit of claim 21, wherein any one of:
the first conductive lines are wordlines and the second conductive lines are bitlines; and
the first conductive lines are bitlines and the second conductive lines are wordlines.

* * * * *